United States Patent
Fukumoto et al.

(10) Patent No.: US 10,186,521 B2
(45) Date of Patent: Jan. 22, 2019

(54) SEMICONDUCTOR DEVICE AND METHOD FOR MANUFACTURING SEMICONDUCTOR DEVICE

(71) Applicant: Toshiba Memory Corporation, Minato-ku (JP)

(72) Inventors: Atsushi Fukumoto, Mie (JP); Fumiki Aiso, Kuwana (JP); Hajime Nagano, Yokkaichi (JP); Takuo Ohashi, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/459,319

(22) Filed: Mar. 15, 2017

(65) Prior Publication Data

US 2018/0083028 A1    Mar. 22, 2018

Related U.S. Application Data

(60) Provisional application No. 62/395,777, filed on Sep. 16, 2016.

(51) Int. Cl.
*H01L 27/11582* (2017.01)
*H01L 27/11556* (2017.01)
(Continued)

(52) U.S. Cl.
CPC .. *H01L 27/11582* (2013.01); *H01L 21/02532* (2013.01); *H01L 21/02592* (2013.01);
(Continued)

(58) Field of Classification Search
CPC ......... H01L 27/11582; H01L 27/11556; H01L 27/02667; H01L 21/3065; H01L 21/02532;
(Continued)

(56) References Cited

U.S. PATENT DOCUMENTS 6,346,732 B1    2/2002  Mizushima et al.
9,064,970 B2 *  6/2015  Simsek-Ege ........ H01L 29/7926
(Continued)

FOREIGN PATENT DOCUMENTS

JP    2001-189451    7/2001
JP    2003-45821     2/2003
(Continued)

OTHER PUBLICATIONS

Passi et al., "Anisotropic vapor HF etching of silicon dioxide for Si microstructure release", Microelectronic Engineering 95 (2012) 83-89.*

*Primary Examiner* — Jarrett J Stark
*Assistant Examiner* — Charles N Ausar-El
(74) *Attorney, Agent, or Firm* — Oblon, McClelland, Maier & Neustadt, L.L.P.

(57) ABSTRACT

According to one embodiment, a semiconductor device includes a foundation layer, a stacked body provided on the foundation layer, the stacked body including a plurality of electrode layers stacked with an insulator interposed, a semiconductor body extending through the stacked body in a stacking direction of the stacked body, and a charge storage portion provided between the semiconductor body and the electrode layers. The semiconductor body includes a first semiconductor film, and a second semiconductor film provided between the first semiconductor film and the charge storage portion. An average grain size of a crystal of the second semiconductor film is larger than an average grain size of a crystal of the first semiconductor film.

1 Claim, 25 Drawing Sheets

(51) Int. Cl.
*H01L 21/3065* (2006.01)
*H01L 27/02* (2006.01)
*H01L 29/04* (2006.01)
*H01L 29/10* (2006.01)
*H01L 21/02* (2006.01)
*H01L 21/311* (2006.01)

(52) U.S. Cl.
CPC .... *H01L 21/02667* (2013.01); *H01L 21/3065* (2013.01); *H01L 21/31116* (2013.01); *H01L 27/11556* (2013.01); *H01L 29/04* (2013.01); *H01L 29/1037* (2013.01); *H01L 29/1041* (2013.01)

(58) Field of Classification Search
CPC ......... H01L 21/02592; H01L 21/02667; H01L 21/31116; H01L 29/04; H01L 29/1037; H01L 29/1041
See application file for complete search history.

(56) References Cited

U.S. PATENT DOCUMENTS

| | | | |
|---|---|---|---|
| 9,431,417 B1* | 8/2016 | Lai | H01L 27/1157 |
| 9,613,979 B2* | 4/2017 | Iinuma | H01L 27/11582 |
| 9,754,954 B2* | 9/2017 | Higuchi | H01L 27/11556 |
| 9,837,430 B2* | 12/2017 | Arisumi | H01L 27/11582 |
| 9,865,614 B2* | 1/2018 | Kamigaichi | H01L 27/1157 |
| 9,905,462 B2* | 2/2018 | Sakata | H01L 21/76879 |
| 9,929,171 B2* | 3/2018 | Aoyama | H01L 27/11582 |
| 2011/0284946 A1 | 11/2011 | Kiyotoshi | |
| 2012/0211821 A1 | 8/2012 | Matsumoto | |
| 2014/0193966 A1* | 7/2014 | You | H01L 27/11582 438/479 |
| 2014/0284694 A1* | 9/2014 | Kitazaki | H01L 29/66833 257/324 |
| 2017/0012053 A1* | 1/2017 | Sun | H01L 27/115 |
| 2017/0018568 A1* | 1/2017 | Fujita | H01L 27/11582 |
| 2017/0054036 A1* | 2/2017 | Dorhout | H01L 29/66666 |
| 2017/0062468 A1* | 3/2017 | Son | H01L 27/11582 |
| 2017/0069647 A1* | 3/2017 | Ohashi | H01L 27/11568 |
| 2017/0207235 A1* | 7/2017 | Lee | H01L 21/28282 |
| 2017/0229473 A1* | 8/2017 | Fukumoto | H01L 27/11582 |
| 2017/0236834 A1* | 8/2017 | Fukumura | H01L 27/11582 257/314 |
| 2017/0271262 A1* | 9/2017 | Naito | H01L 23/5283 |
| 2017/0271362 A1* | 9/2017 | Sonehara | H01L 27/11582 |
| 2017/0271527 A1* | 9/2017 | Higuchi | H01L 29/7923 |
| 2017/0278851 A1* | 9/2017 | Fujii | H01L 27/1157 |
| 2017/0317098 A1* | 11/2017 | Dorhout | H01L 29/66666 |
| 2017/0317099 A1* | 11/2017 | Huang | H01L 23/5226 |
| 2017/0323899 A1* | 11/2017 | Park | H01L 21/0228 |
| 2017/0330752 A1* | 11/2017 | Kim | H01L 21/02532 |
| 2018/0076213 A1* | 3/2018 | Kaneko | H01L 21/02667 |
| 2018/0190669 A1* | 7/2018 | Kaneko | H01L 21/02667 |
| 2018/0240809 A1* | 8/2018 | Ye | H01L 27/11582 |

FOREIGN PATENT DOCUMENTS

| | | |
|---|---|---|
| JP | 2009-238874 | 10/2009 |
| JP | 2012-174961 | 9/2012 |

* cited by examiner

SEMICONDUCTOR DEVICE AND METHOD FOR MANUFACTURING SEMICONDUCTOR DEVICE

CROSS-REFERENCE TO RELATED APPLICATIONS

This application is based upon and claims the benefit of priority from U.S. Provisional Patent Application 62/395,777 filed on Sep. 16, 2016; the entire contents of which are incorporated herein by reference.

FIELD

Embodiments described herein relate generally to a semiconductor device and a method for manufacturing a semiconductor device.

BACKGROUND

A three-dimensional memory device that includes multiple electrode layers stacked on a substrate, and a semiconductor body piercing the multiple electrode layers in the stacking direction of the multiple electrode layers to reach the substrate has been proposed. The semiconductor body is formed inside a hole formed in a stacked body including the multiple electrode layers or multiple sacrificial layers.

DETAILED DESCRIPTION

Figure 1:
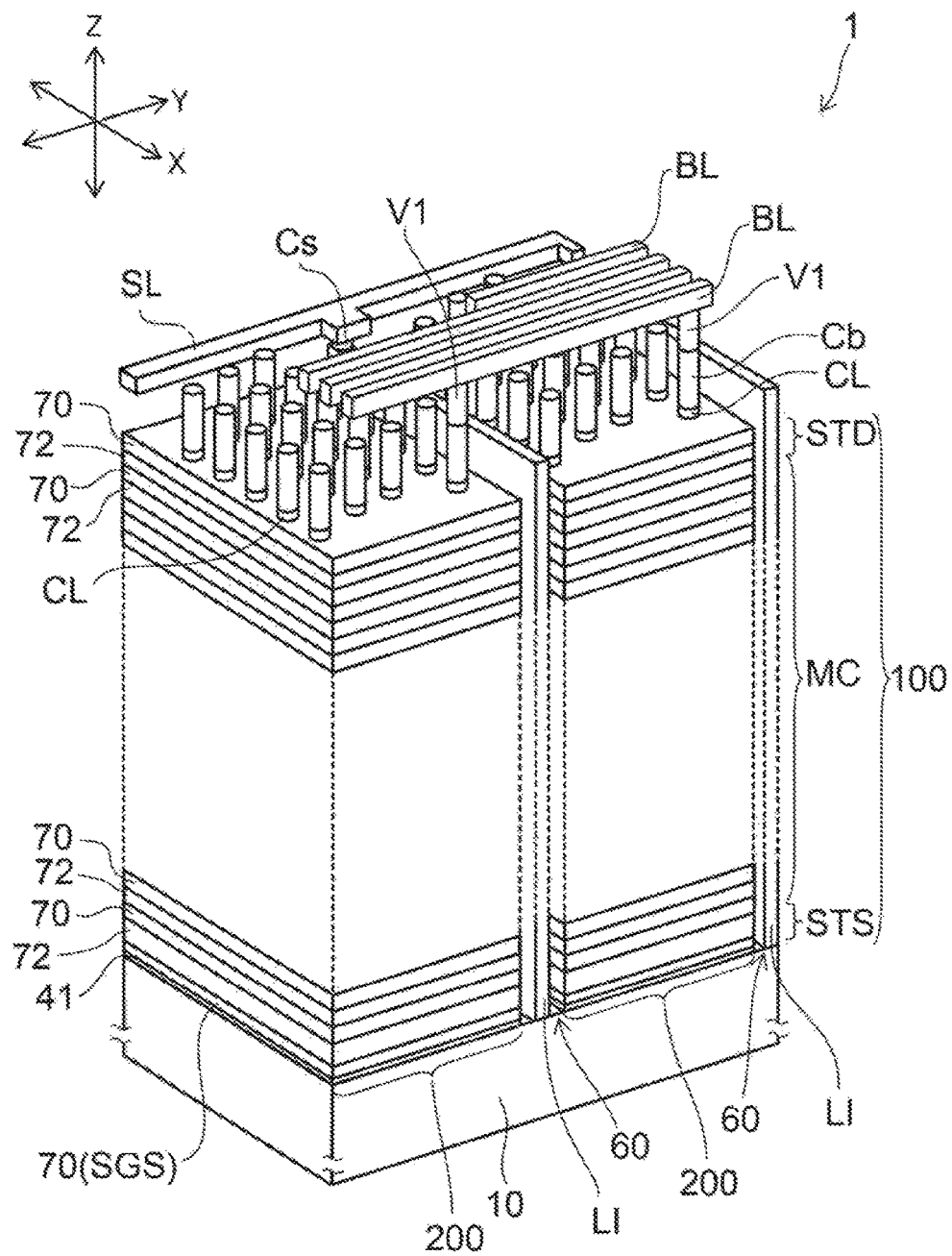
FIG. 1 is a schematic perspective view of a semiconductor device of an embodiment.

According to one embodiment, a semiconductor device includes a foundation layer, a stacked body provided on the foundation layer, the stacked body including a plurality of electrode layers stacked with an insulator interposed, a semiconductor body extending through the stacked body in a stacking direction of the stacked body, and a charge storage portion provided between the semiconductor body and the electrode layers. The semiconductor body includes a first semiconductor film, and a second semiconductor film provided between the first semiconductor film and the charge storage portion. An average grain size of a crystal of the second semiconductor film is larger than an average grain size of a crystal of the first semiconductor film.

Embodiment will now be described with reference to the drawings. In the respective drawings, like members are labeled with like reference numerals.

In the embodiment, for example, a semiconductor memory device including a memory cell array having a three-dimensional structure is described as the semiconductor device.

FIG. 1 is a schematic perspective view of the memory cell array 1 of the embodiment.

Figure 2:
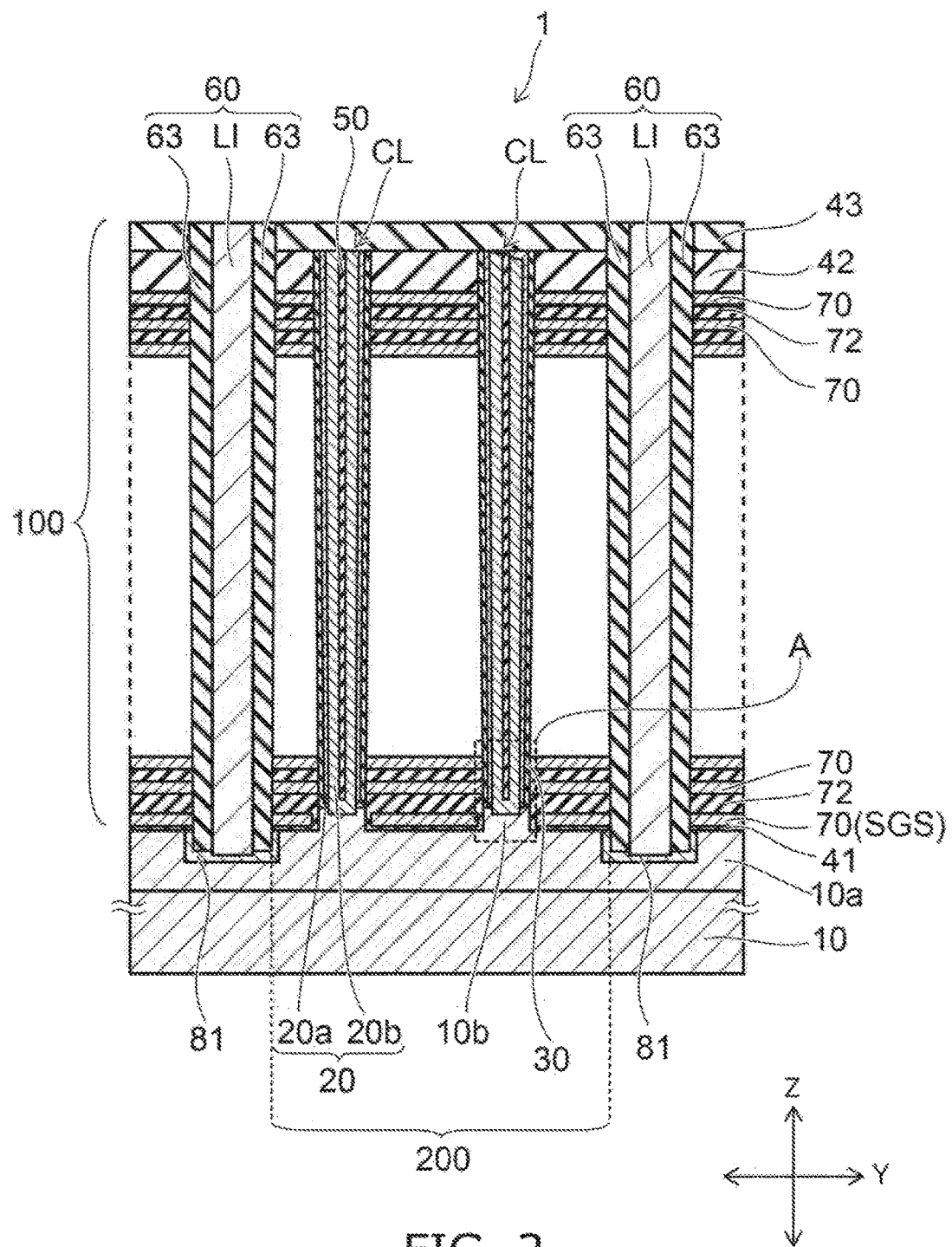
FIG. 2 is a schematic cross-sectional view of a semiconductor device of an embodiment.

FIG. 2 is a schematic cross-sectional view the memory cell array 1.

Figure 3:
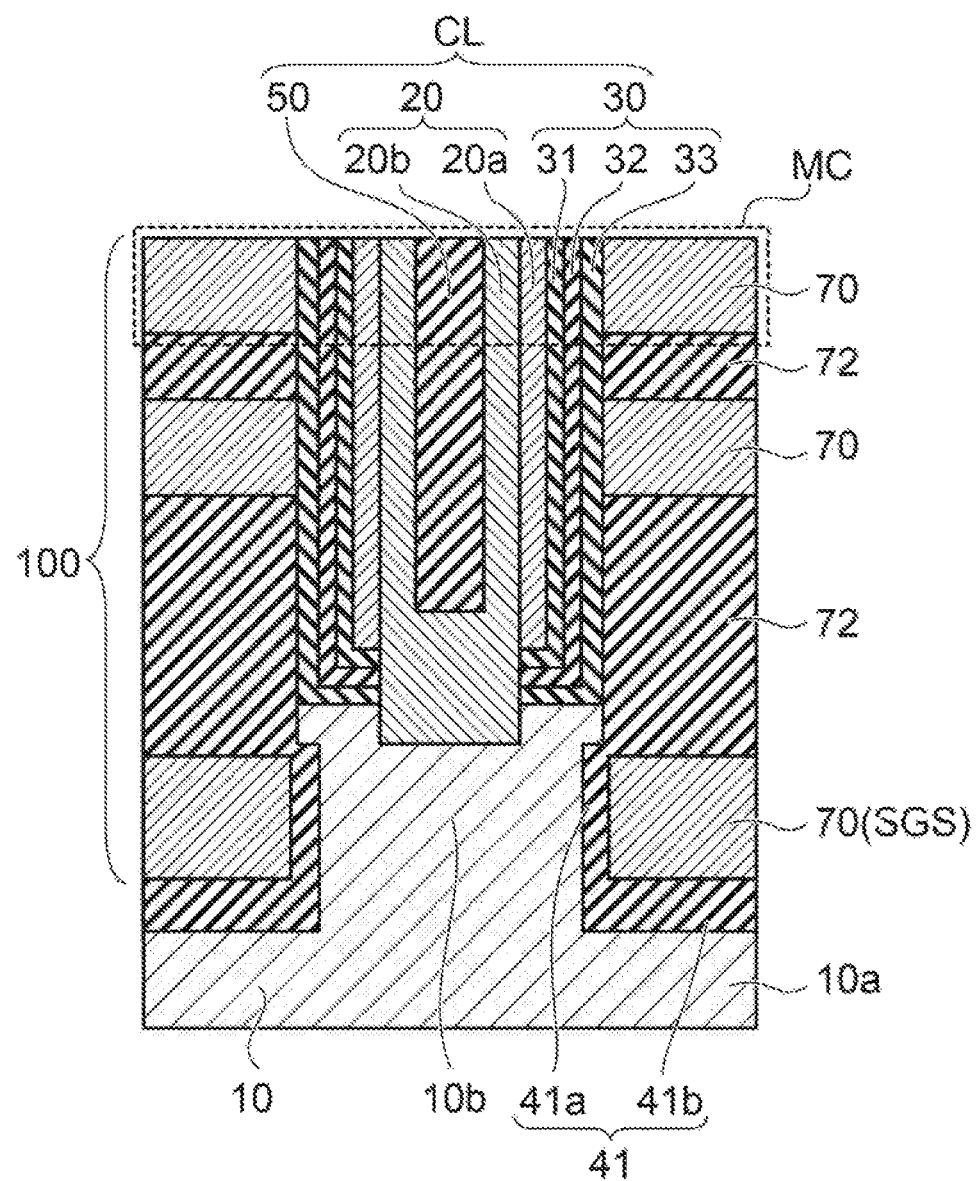
FIG. 3 is an enlarged schematic cross-sectional view of portion A of FIG. 2.

FIG. 3 is an enlarged schematic cross-sectional view of portion A of FIG. 2.

In FIG. 1, two mutually-orthogonal directions parallel to a major surface of a substrate 10 are taken as an X-direction and a Y-direction; and a direction orthogonal to both the X-direction and the y-direction is taken as a Z-direction (a stacking direction). The Y-direction and the Z-direction shown in FIG. 2 respectively correspond to the Y-direction and the Z-direction of FIG. 1.

The memory cell array 1 includes the substrate 10 as a foundation layer, a stacked body 100 provided on the substrate 10, multiple columnar portions CL, multiple separation portions 60, and upper layer interconnects provided above the stacked body 100. In FIG. 1, for example, bit lines BL and a source line SL are shown as the upper layer interconnects.

The columnar portions CL are formed in substantially circular columnar configurations extending through the stacked body 100 in the stacking direction of the stacked body 100 (the Z-direction). The separation portions 60 spread in the Z-direction and the X-direction on the substrate 10 and divide the stacked body 100 into multiple blocks (or finger portions) 200 in the Y-direction.

For example, the multiple columnar portions CL have a staggered arrangement. Or, the multiple columnar portions CL may have a square lattice arrangement along the X-direction and the Y-direction.

The multiple bit lines BL are provided above the stacked body 100. The multiple bit lines BL extend in the Y-direction and are, for example, metal films. The multiple bit lines BL are separated from each other in the X-direction.

The upper ends of semiconductor bodies 20 of the columnar portions CL described below are connected to the bit lines BL via contacts Cb and contacts V1 shown in FIG. 1.

Multiple columnar portions CL are connected to one common bit line BL. The multiple columnar portions CL that are connected to the common bit line BL include one columnar portion CL selected from each block (or finger portion) 200 divided in the Y-direction by, the separation portions 60.

As shown in FIG. 2 and FIG. 3, the substrate 10 includes a first portion 10b and a second portion 10a, The substrate 10 that includes the first portion 10b and the second portion 10a is a semiconductor substrate, e.g., a silicon substrate including mainly silicon.

The second portion 10a is a P-type silicon region (a P-type well) provided on the front surface side of the substrate 10.

The first portion 10b protrudes higher than the upper surface of the second portion 10a. The first portion 10b is provided in a columnar configuration under the columnar portion CL. The multiple first portions 10b are provided to correspond to the multiple columnar portions CL.

As described below, the first portion 10b is a crystal layer epitaxially grown from the second portion 10a; and the first portion 10b and the second portion 10a are one body, of a monocrystalline region. The first portion 10b has substantially the same crystal orientation as the crystal orientation of the second portion 10a.

The first portion 10b also is a P-type silicon region. The first portion 10b and the second portion 10a include, for example, boron as a P-type impurity.

An insulating film 41 is provided between the stacked body 100 and the upper surface of the second portion 10a. The stacked body 100 is provided on the insulating film 41.

The stacked body 100 includes multiple electrode layers 70. The multiple electrode layers 70 are stacked, with insulating layers (insulating bodies) 72 interposed, in a direction (the Z-direction) perpendicular to the major surface (the upper surface of the second portion 10a) of the substrate 10. The electrode layers 70 are metal layers, e.g., tungsten layers or molybdenum layers.

As shown in FIG. 2, an insulating film 42 is provided on the electrode layer 70 of the uppermost layer; and an insulating film 43 is provided on the insulating film 42. The insulating film 43 covers the upper ends of the columnar portions CL.

The electrode layer 70 of the lowermost layer is provided on the insulating film 41. As described below, the electrode, layer 70 of the lowermost layer functions as a source-side selection gate SGS of a source-side selection transistor STS. Accordingly, there are also cases where the electrode layer 70 of the lowermost layer is illustrated using the reference numeral SGS.

As shown in FIG. 3, the upper surface of the first portion 10b of the substrate 10 is positioned at a height that is higher than the upper surface of the electrode layer SGS of the lowermost layer and lower than the lower surface of the electrode layer 70 of the second layer from the bottom. The upper surface of the first portion 10b is positioned at the side of the insulating layer 72 of the lowermost layer.

The electrode layer SGS of the lowermost layer opposes the side surface of the first portion 10b on the second portion 10a of the substrate 10. The electrode layer SGS of the lowermost layer is provided lower than stacked films 30 of the columnar portions CL described below.

The insulating film 41 includes, for example, mainly silicon oxide. The insulating film 41 includes a first insulating portion 41a and a second insulating portion 41b. The first insulating portion 41a is provided between the side surface of the first portion 10b of the substrate 10 and the side surface of the electrode layer SGS of the lowermost layer. The electrode layer SGS of the lowermost layer surrounds, with the first insulating portion 41a interposed, the periphery of the first portion lob having the columnar configuration.

The second insulating portion 41b of the insulating film 41 is provided between the upper surface of the second portion 10a of the substrate 10 and the lower surface of the electrode layer SGS of the lowermost layer.

The distance between the electrode layer SGS of the lowermost layer and the electrode layer 70 of the second layer from the bottom is greater than the distance between the other electrode layers 70. The thickness of the insulating layer 72 of the lowermost layer is thicker than the thicknesses of the other insulating layers 72.

As shown in FIG. 3, the columnar portion CL includes a stacked film (a memory film) 30, the semiconductor body 20, and a core film 50 that is insulative. The semiconductor body 20, the stacked film 30, and the core film 50 extend in the stacking direction of the stacked body 100 on the first portion 10b of the substrate 10.

The semiconductor body 20 is formed in a cylindrical configuration; and the core film 50 is provided on the inner side of the semiconductor body 20. The stacked film 30 is provided between the semiconductor body 20 and the electrode layers 70 higher than the electrode layer SGS of the lowermost layer axed surrounds the periphery of the semiconductor body 20.

The semiconductor body 20 includes, for example, mainly polycrystalline silicon. The semiconductor body 20 includes a first semiconductor film 20b and a second semiconductor film (a cover film) 20a. The second semiconductor film 20a provided between the stacked film 30 and the first s conductor film 20b. The first semiconductor film 20b is provided between the second semiconductor film 20a and the core film 50.

The lower end of the first semiconductor film 20b is positioned lower than the lower end of the second semiconductor film 20a and contacts the first portion 10b of the substrate 10. The stacked film 30 is provided between the first portion 10b and the second semiconductor film 20a; and the lower end of the second semiconductor film 20a does not contact the first portion 10b.

The upper end of the semiconductor body 20 is connected to the bit line BL via the contact Cb and the contact V1 shown in FIG. 1.

The stacked film 30 includes a tunneling insulating film (a first insulating film) 31, a charge storage film (a charge storage portion) 32, and a blocking insulating film (a second insulating film) 33. The blocking insulating film 33, the charge storage film 32, and the tunneling insulating film 31 are provided in order from the electrode layer 70 side between the semiconductor body 20 and the electrode layers 70 higher than the electrode layer SGS of the lowermost layer. Further, there are also cases where a blocking film is provided also between the insulating layer 72 and the electrode layers 70.

The semiconductor body 20, the stacked film 30, and the electrode layer 70 are included in a memory cell MC. One memory cell MC is schematically illustrated by the broken line in FIG. 3. The memory cell MC has a vertical transistor structure in which the electrode layer 70 surrounds, with the stacked film 30 interposed, the periphery of the semiconductor body 20.

In the memory cell MC having the vertical transistor structure, the semiconductor body 20 is a channel body; and the electrode layer 70 functions as a control gate. The charge storage film 32 functions as a data storage layer that stores charge injected from the semiconductor body 20.

The semiconductor memory device of the embodiment is a nonvolatile semiconductor memory device that can freely and electrically erase/program data and can retain the memory content even when the power supply is OFF.

The memory cell MC is, for example, a charge trap memory cell. The charge storage film 32 has many trap sites that trap charge inside an insulative film and includes, for example, a silicon nitride film. Or, the charge storage film 32 may be a conductive floating gate surrounded with an insulator.

The tunneling insulating film 31 is used as a potential barrier when the charge is injected from the semiconductor body 20 into the charge storage film 32 or when the charge stored in the charge storage film 32 is discharged into the semiconductor body 20. The tunneling insulating film 31 includes, for example, a silicon oxide film.

The blocking insulating film 33 prevents the charge stored in the charge storage film 32 from being discharged into the electrode layer 70. Also, the blocking insulating film 33 prevents back-tunneling of electrons from the electrode layer 70 into the columnar portion CL.

The blocking insulating film 33 includes, for example, a silicon oxide film. Or, a stacked film of a silicon oxide film and, a metal oxide film having a higher dielectric constant than the silicon oxide film may be provided as the blocking insulating film between the charge storage film 32 and the electrode layer 70.

As shown in FIG. 1, a drain-side selection transistor STD is provided at the upper layer portion of the stacked body 100 (the upper end portion of the, columnar portion CL). The source-side selection transistor STS is provided at the lower layer portion of the stacked body 100 (the lower end portion of the columnar portion CL). The electrode layer 70 of at least the uppermost layer functions as a control gate of the drain-side selection transistor STD. The electrode layer SGS of at least the lowermost layer functions as a control gate of the source-side selection transistor STS.

The multiple memory cells MC are provided between the drain-side selection transistor STD and the source-side selection transistor STS. The multiple memory cells MC, the drain-side selection transistor STD, and the source-side selection transistor STS are connected in series via the semiconductor body 20 of the columnar portion CL and are included in one memory string. For example, the memory strings have a staggered arrangement in a planar direction parallel to the XY plane; and the multiple memory cells MC are provided three-dimensionally in the X-direction, the Y-direction, and the Z-direction.

The separation portion 60 will now be described.

As shown in FIG. 2, the separation portion 60 includes an interconnect portion LI and an insulating film 63. The insulating film 63 is not illustrated in FIG. 1.

The interconnect portion LI spreads in the X-direction and the Z-direction and is, for example, a film including a metal. The insulating film 63 is provided at the side surface of the interconnect portion LI. The insulating film 63 is provided between the interconnect portion LI and the stacked body 100.

Multiple semiconductor regions 81 are formed in the front surface of the second portion (the P-type well) 10a of the substrate 10. The lower ends of the interconnect portions LI contact the semiconductor regions 81 The multiple semiconductor regions 81 are provided to correspond to the multiple interconnect portions LI.

The multiple semiconductor regions 81 include N-type semiconductor regions 81. The multiple interconnect portions LI include interconnect portions LI connected to the N-type semiconductor regions 81. The upper ends of the interconnect portions LI connected to the N-type semiconductor regions 81 are connected to the source line SL via a contact Cs shown in FIG. 1.

In a read operation, electrons are supplied from the interconnect portions LI to the semiconductor bodies 20 via the N-type semiconductor regions 81 and the second portion 10a and the first portions 10b of the substrate 10.

The electrode layer SGS of the lowermost layer functions as a control gate of a bottom transistor; and the second insulating portion 41b and the first insulating portion 41a of the insulating film 41 shown in FIG. 3 function as a gate insulating film of the bottom transistor. The bottom transistor has a structure in which the electrode layer SGS of the lowermost layer surrounds, with the first insulating portion 41a interposed, the periphery of the first portion 10b of the substrate 10. Also, the electrode layer SGS of the lowermost layer opposes, with the second insulating portion 41b interposed, the upper surface of the second portion 10a of the substrate 10.

The source-side selection transistor STS includes at least the bottom transistor. Or, the source-side selection transistor STS includes multiple transistors in which multiple layers of the electrode layers 70 from the bottom including the electrode layer SGS of the lowermost layer are used as control gates.

By controlling the potential applied to the electrode layer SGS of the lowermost layer, an N-type inversion layer (an N-channel) can be induced at the upper surface vicinity of the P-type second portion 10a and the side surface vicinity of the P-type first portion 10b; and a current can be caused to flow between the N-type semiconductor region 81 and the lower end of the semiconductor body 20.

By appropriately controlling the P-type impurity concentrations of the first portion 10b and the second portion 10, the bottom transistor can be cut off without the N-channel recited above being induced when the potential of the electrode, layer SGS of the lowermost layer is 0 V. In other words, a normally-off type source-side selection transistor STS can be obtained.

A method for manufacturing the semiconductor device of the embodiment will now be described with reference to FIG. 4 to FIG. 15.

Figure 4:
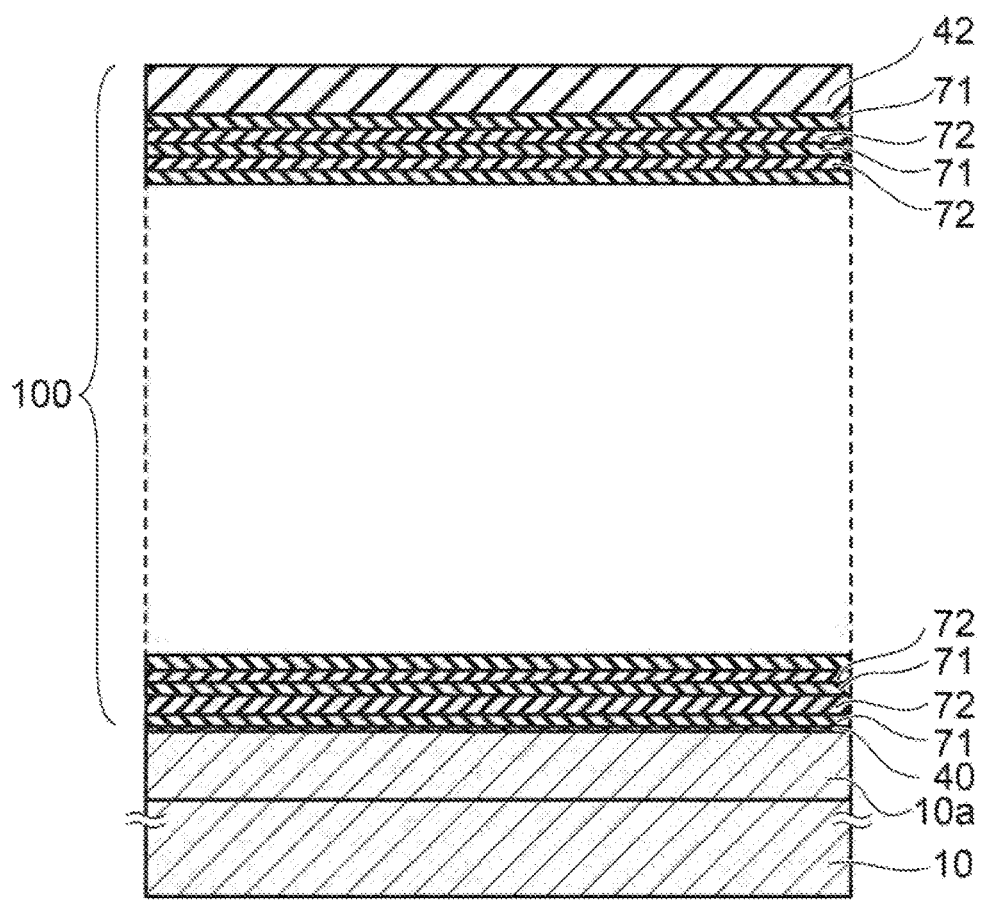
FIGS. 4 to 23B are schematic cross-sectional views showing a method for manufacturing the semiconductor device according to the embodiment.

As shown in FIG. 4, the stacked body 100 is formed, with a foundation insulating film 40 interposed, on the second portion (the P-type well) 10a of the substrate 10. The substrate 10 is a silicon substrate having silicon as a major component. The foundation insulating film 40 includes silicon oxide.

A sacrificial layer 71 as a first layer and the insulating layer 72 as a second layer are stacked alternately on the foundation insulating film 40. The process of alternately stacking the sacrificial layer 71 and the insulating layer 72 is repeated; and the multiple sacrificial layers 71 and the multiple insulating layers 72 are formed on the substrate 10. For example, the sacrificial layers 71 are silicon nitride layers; and the insulating layers 72 are silicon oxide layers.

The sacrificial layer 71 of the lowermost layer is formed on the foundation insulating film 40; and the insulating layer 72 is not provided between the foundation insulating film 40 and the sacrificial layer 71 of the lowermost layer. The insulating film 42 is formed on the sacrificial layer 71 of the uppermost layer.

Figure 5:
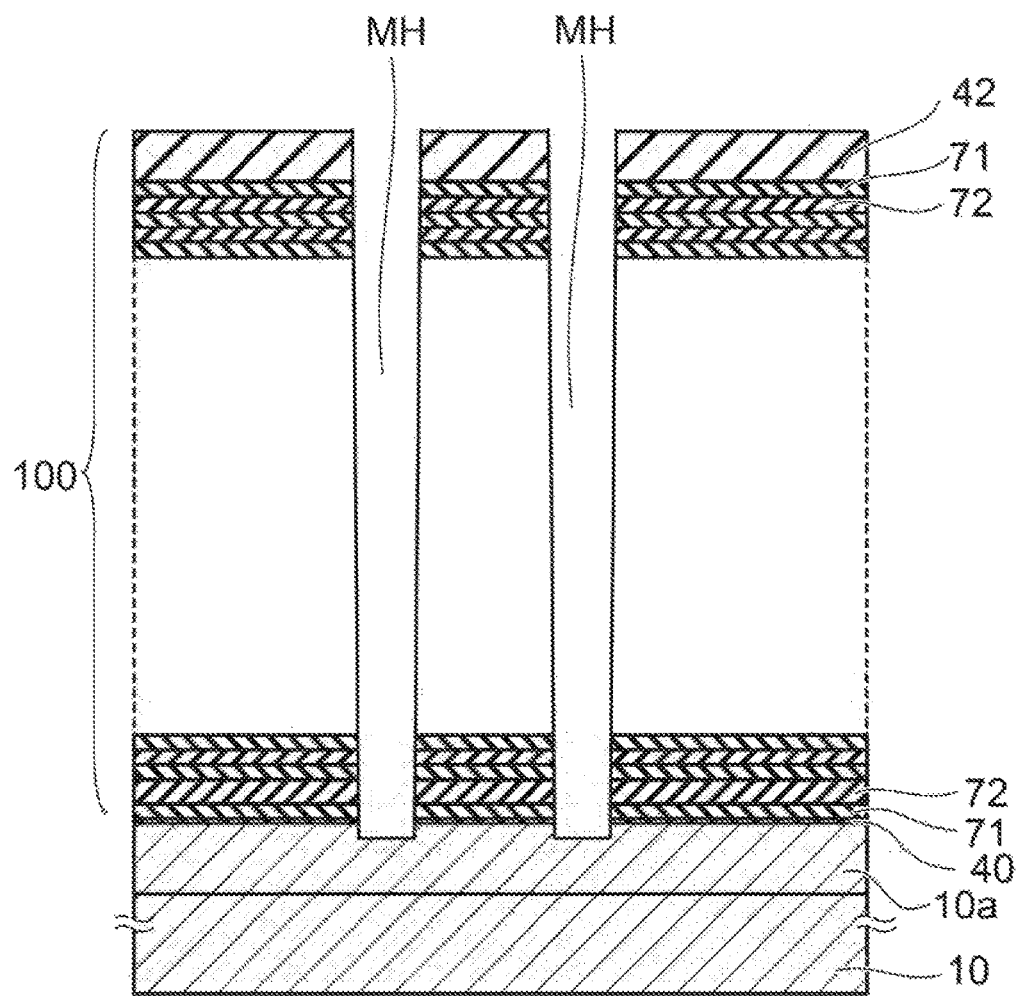

As shown in FIG. 5, multiple memory holes MH are formed in the stacked body 100 by, for example, reactive ion etching (RIE) using a not-illustrated mask. The memory holes MH pierce the stacked body 100 and the foundation, insulating film 40 and reach the second portion 10a of the substrate 10. The second portion 10a of the substrate 10 is exposed at the bottoms of the memory holes MH.

Figure 6:
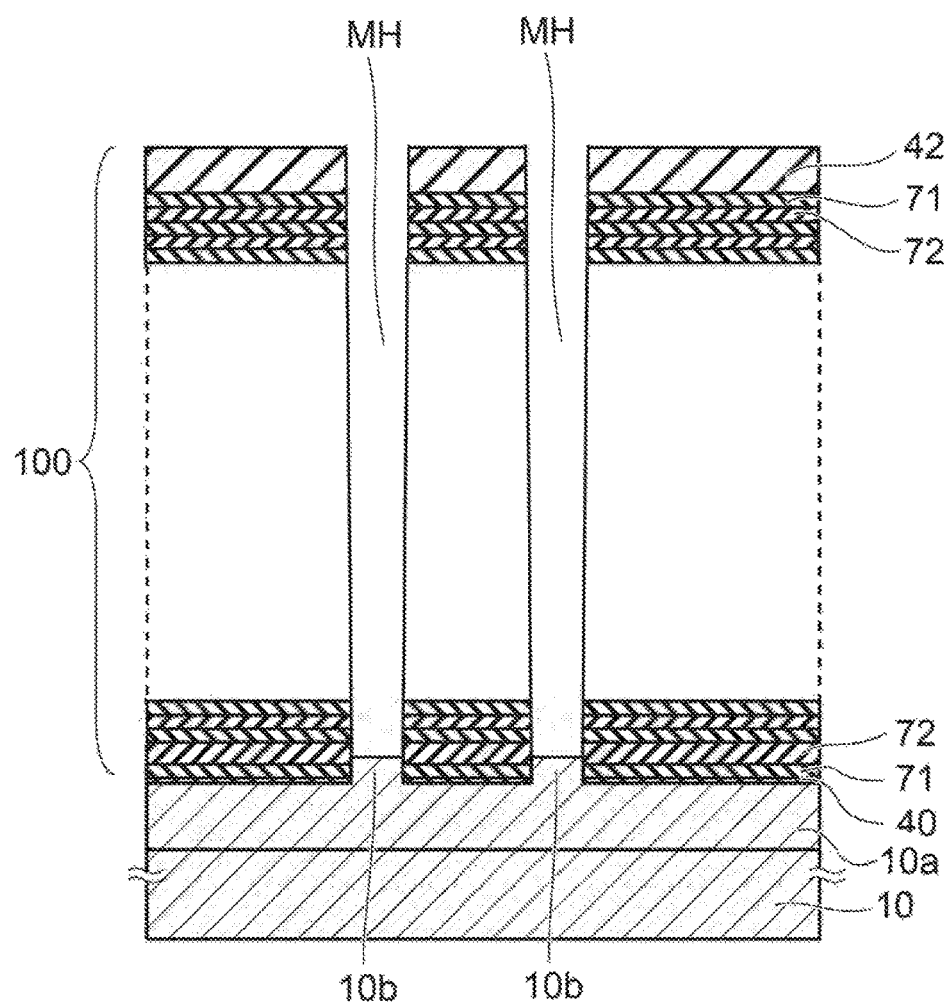

Silicon is epitaxially grown from the exposed portions of the second portion 10a at the bottoms of the memory holes MH. As shown in FIG. 6, the first portions 10b are formed as crystal layers of silicon at the bottoms of the memory holes MH.

The first portions 10b are grown to a height that is higher than the upper surface of the sacrificial layer 71 of the lowermost layer and lower than the upper surface of the insulating layer 72 of the lowermost layer.

Figure 7:
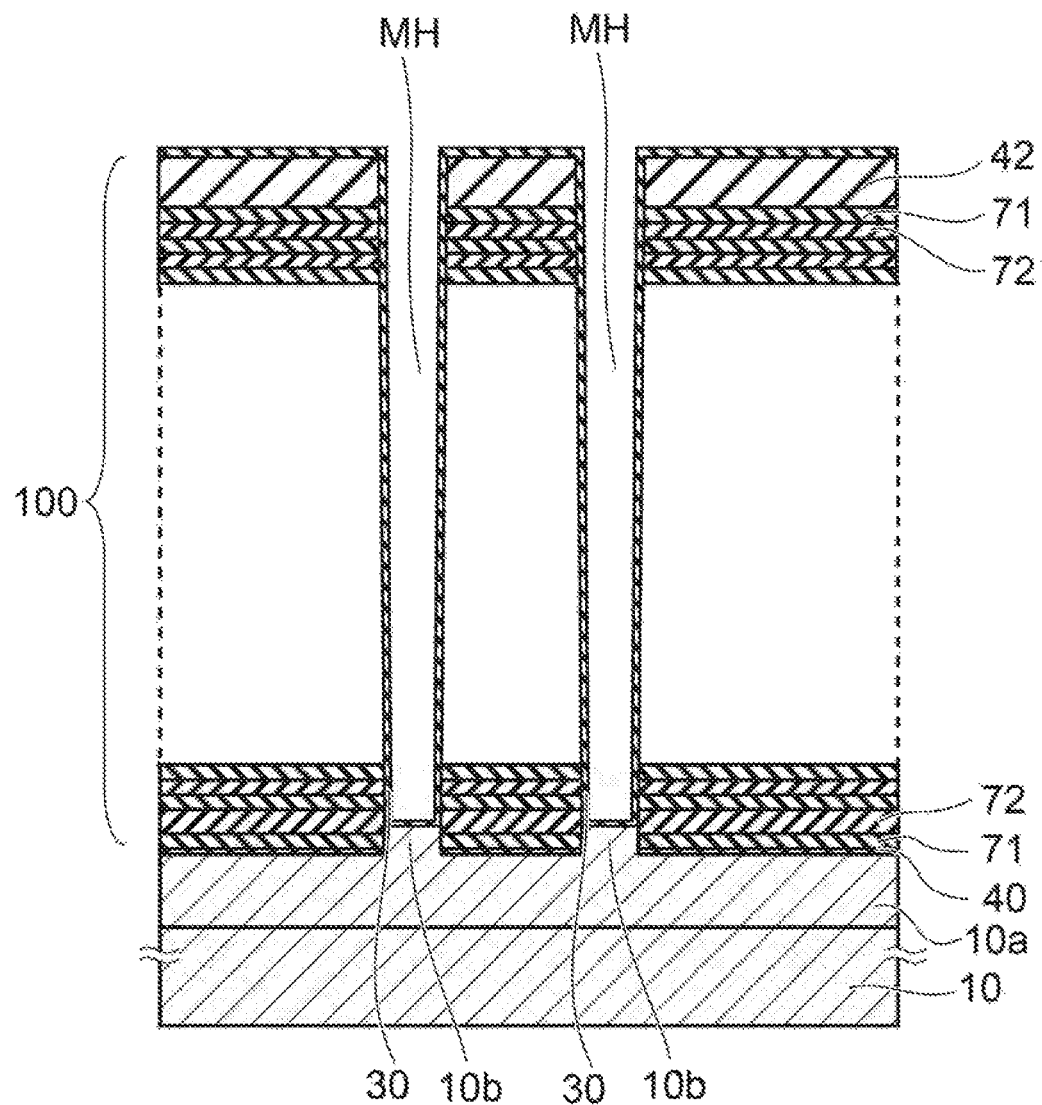

As shown in FIG. 7, the stacked film 30 is formed inside the memory holes MH on the first portions 10b. The stacked film 30 is formed conformally along the side surfaces of the memory holes MH and the upper surfaces of the first portions 10b.

Figure 8:
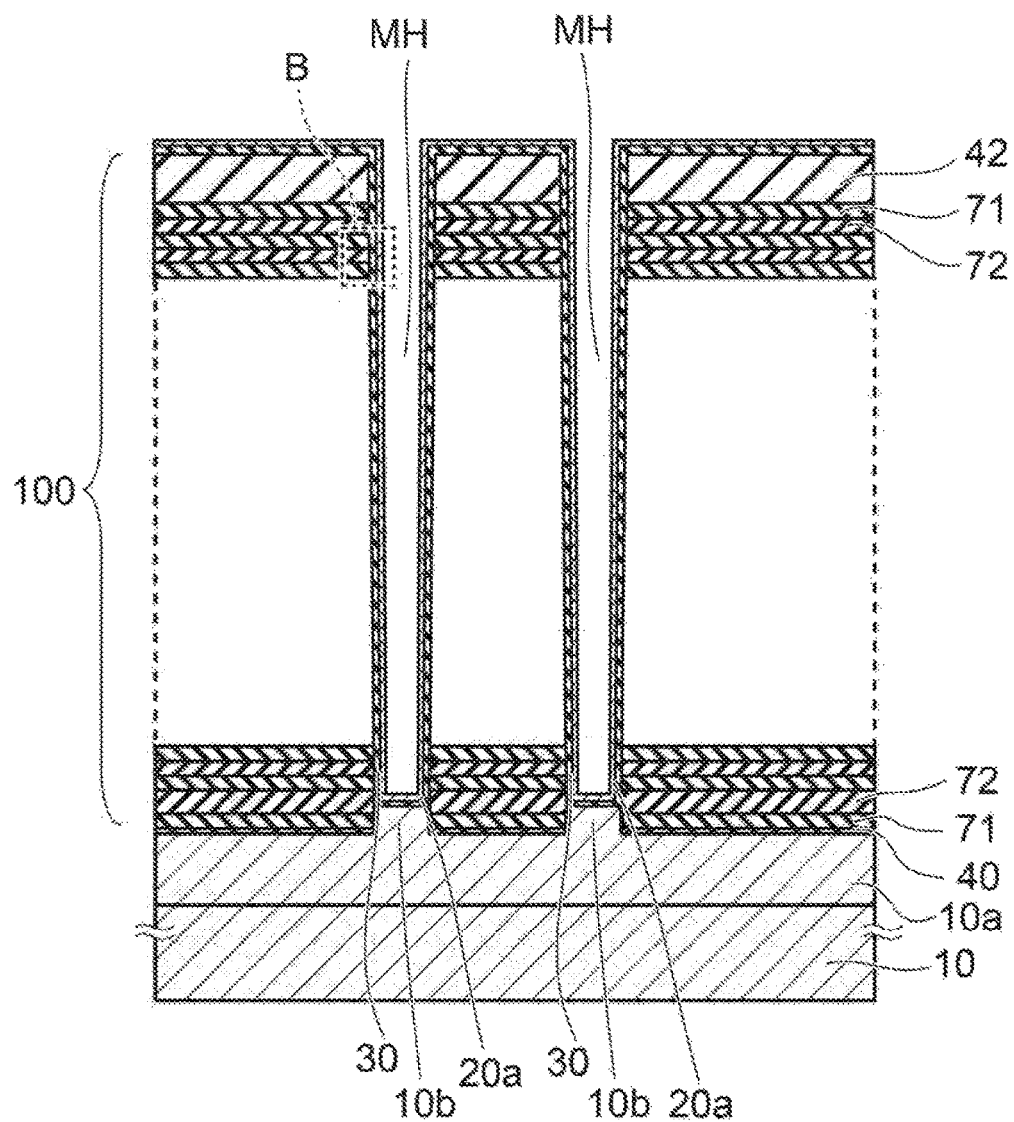

As shown in FIG. 8, the cover film 20a is formed on the inner side of the stacked film 30. The cover film 20a is formed conformally along the side surfaces of the memory holes MH and the upper surfaces of the first portions 10b. Gaps remain on the inner sides of the cover film 20a.

Figure 9:
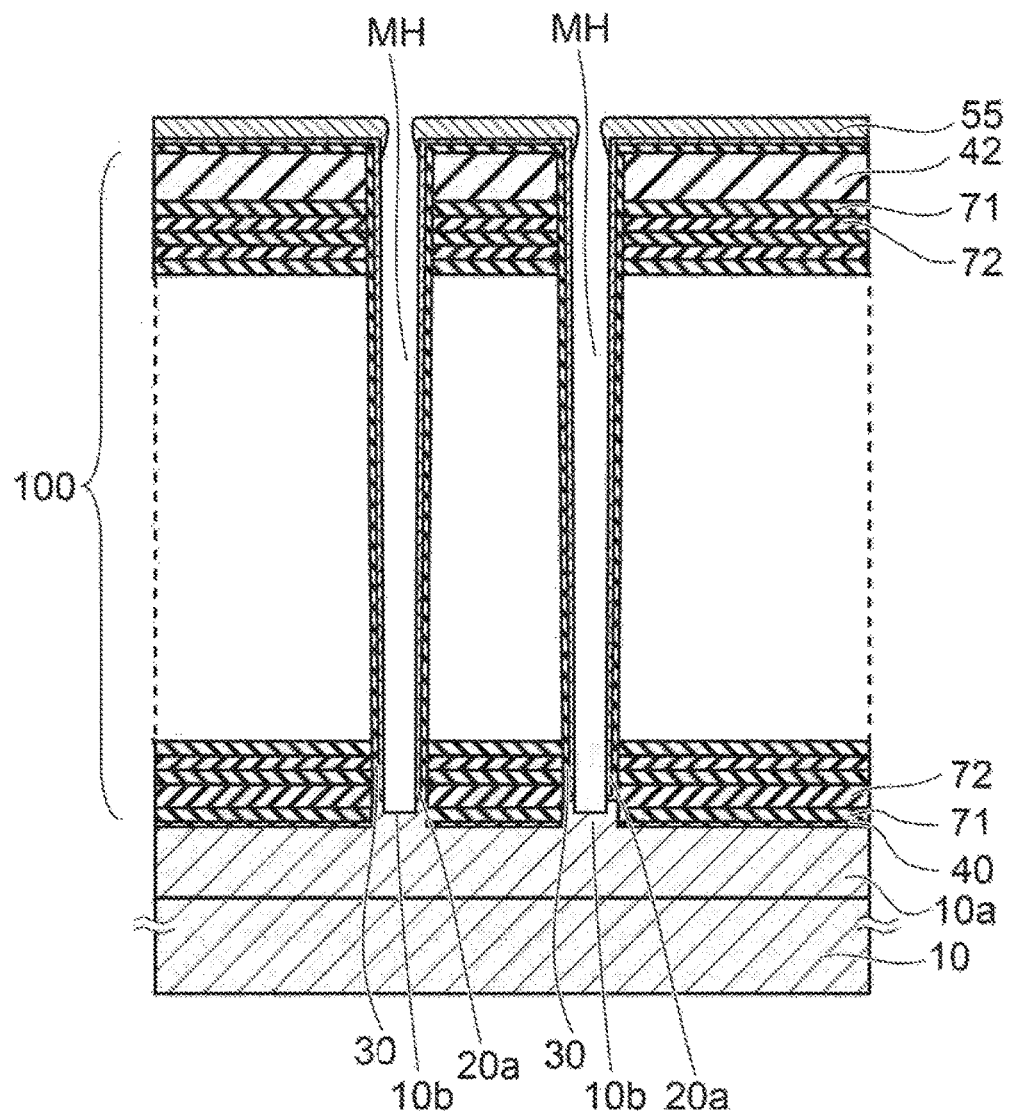

Then, as shown in FIG. 9, a mask layer 55 is formed on the stacked body 100; and the cover film 20a and the stacked film 30 that are deposited on the first portions 10b inside the memory holes MH are removed by RIE. The first portions 10b are exposed at the bottoms of the memory holes MH. In the RIE, the stacked film 30 that is formed on the side surfaces of the memory holes MH is covered with and protected by the cover film 20a and is not damaged by the RIE.

Subsequently, an inner portion of the cover film 20a adjacent to the gap and remaining on the inner side of the stacked film 30 at the side surfaces of the memory holes MH is removed. As described below, the inner portion of the cover film 20a recited above which is a silicon film is removed by etching using a gas including a halogen. The specific process is elaborated below.

By this etching, the portion of the cover film 20a that is damaged by the RIE in the bottom etching recited above can be removed.

Figure 10:
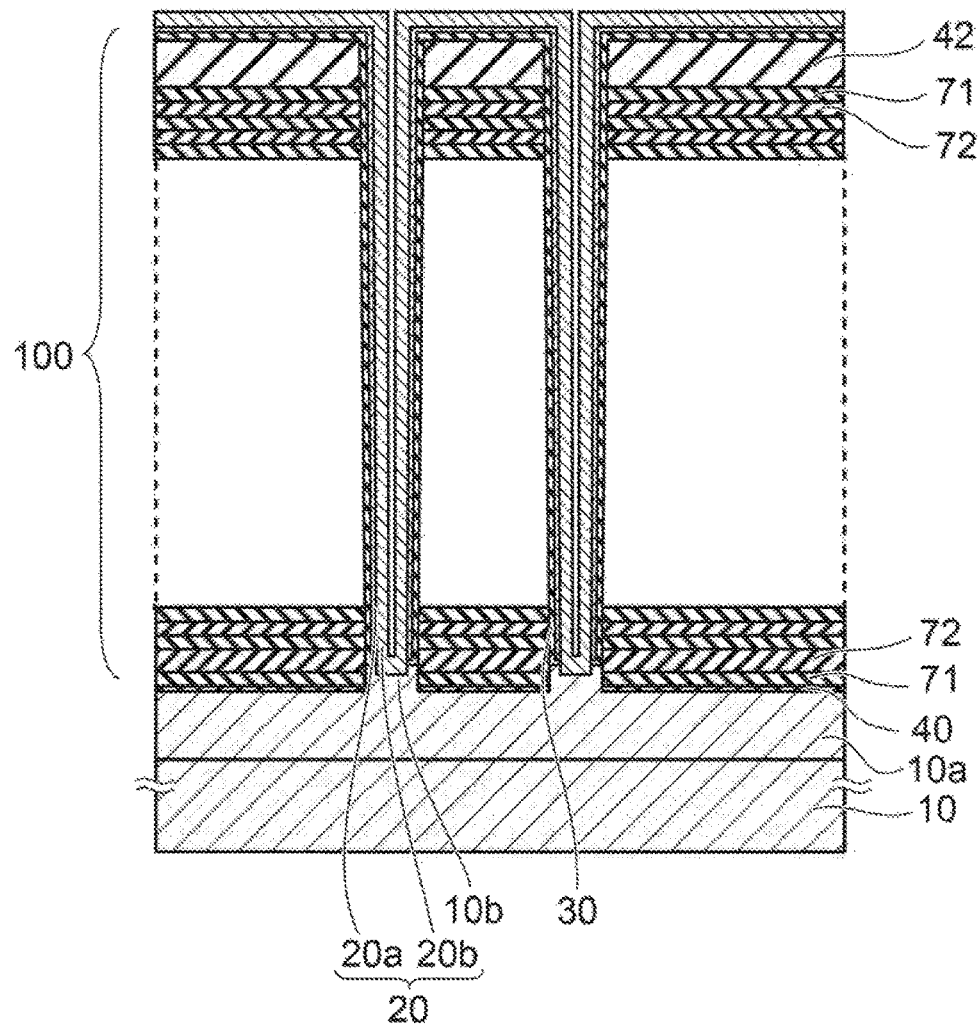

Then, after removing the mask layer 55, the semiconductor film (the silicon body) 20b is formed inside the memory holes MH as shown in FIG. 10. The semiconductor film 20b is formed on the side surface of the cover film 20a and on the bottoms of the memory holes MH where the first portions 10b are exposed. The lower end portions of the semiconductor film 20b contact the first portions 10b.

The cover film 20a and the semiconductor film 20b are included in the semiconductor body 20 described above. The semiconductor film 20b is formed on the side surface of the cover film 20a where the RIE damage layer is removed. Accordingly, according to the embodiment, the semiconductor body 20 that has high mobility and does not include an RIE damage layer is obtained.

The entire cover film 20a in the film thickness direction is not removed; and only the inner portion is selectively removed. Accordingly, the side surface of the tunneling insulating film 31 of the stacked film 30 is not exposed and does not undergo exposure to the halogen used in the etching to remove the cover film 20a. The halogen is not adsorbed on (does not remain on) the side surface of the tunneling insulating film 31 and does not cause film property degradation of the tunneling insulating film 31.

Also, although the tunneling insulating film (the silicon oxide film) 31 where the halogen remains may cause an obstruction of the film formation of the semiconductor film (the silicon body) 20b, according to the embodiment, the semiconductor film 20b can be formed on the side surface of the cover film (the silicon film) 20a remaining to cover the side surface of the tunneling insulating film 31.

Figure 11:
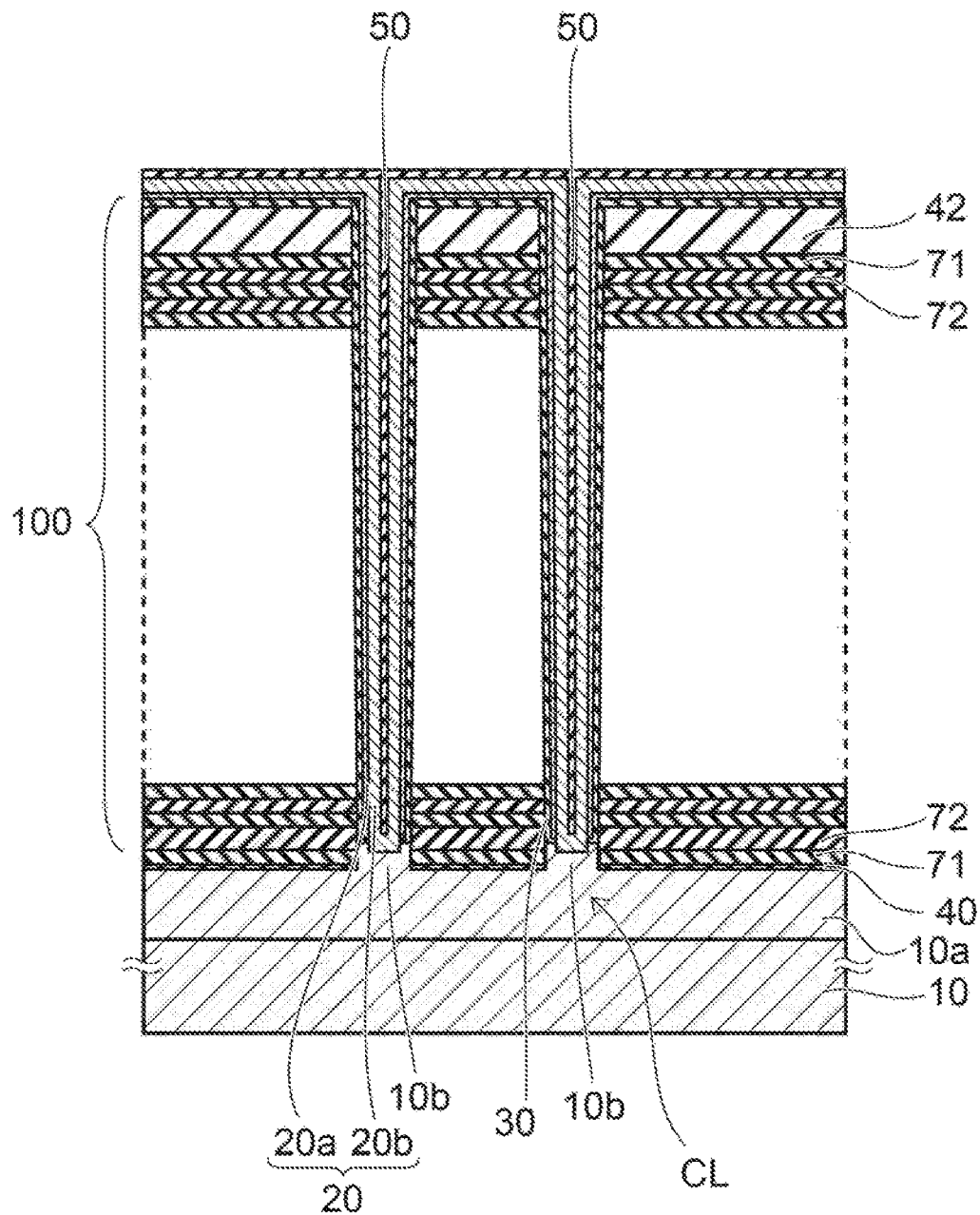

As shown in FIG. 11, the core film 50 is formed on the inner side of, the semiconductor film 20b. The columnar portion CL that includes the stacked film 30, the semiconductor body 20, and the core film 50 is formed inside the stacked body 100.

Figure 12:
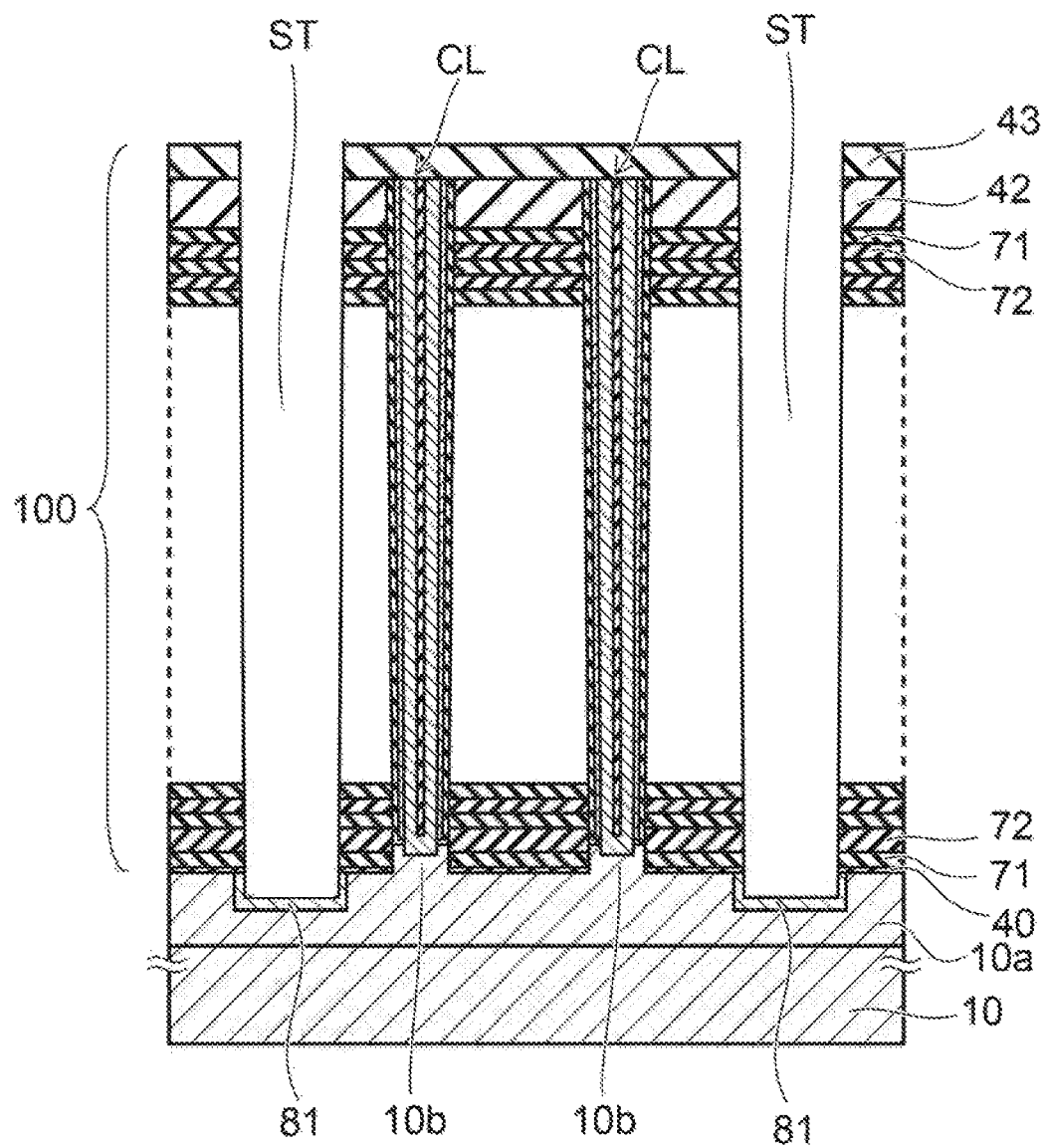

The films that are deposited on the insulating film 42 shown in FIG. 11 are removed by chemical mechanical polishing (CMP) or etch-back. Subsequently, as shown in FIG. 12, the insulating film 43 is formed on the insulating film 42. The insulating film 43 covers the upper ends of the columnar portions CL.

Then, as shown in FIG. 12, multiple slits ST that extend in the X-direction and the stacking direction of the stacked body 100 are formed. The slits ST are formed by RIE using a not-illustrated mask. The slits ST pierce the insulating film 43, the insulating film 42, the multiple sacrificial layers 71, the multiple insulating layers 72, and the foundation insulating film 40 and reach the second portion 10a of the substrate 10.

An impurity is implanted by ion implantation into the second portion 10a exposed at the bottoms of the slits ST; and the N-type semiconductor regions 81 are formed in the front surface of the second portion 10a at the bottoms of the slits ST.

Then, the sacrificial layers 71 are removed by an etchant or an etching gas supplied via the slits ST. For example, the sacrificial layers 71 which are silicon nitride layers are removed using an etchant including phosphoric acid.

Figure 13:
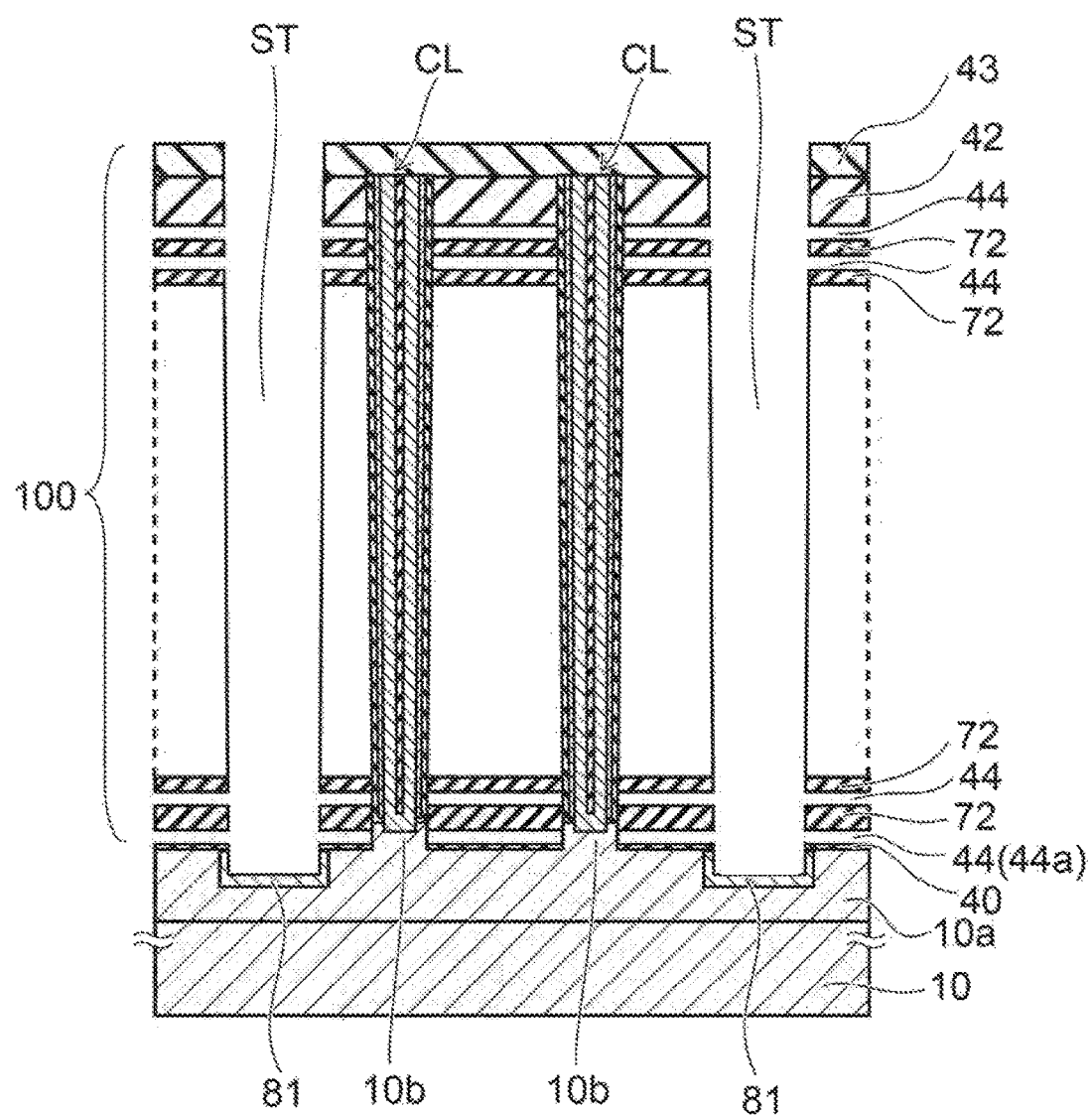

The sacrificial layers 71 are removed; and gaps 44 are formed between the insulating layers 72 adjacent to each other above and below as shown in FIG. 13. The gaps 44 are formed also between the foundation insulating film 40 and the insulating layer 72 of the lowermost layer and between the insulating film 42 and the insulating layer 72 of the uppermost layer.

The multiple insulating layers 72 contact the side surfaces of the multiple columnar portions CL to surround the, side surfaces. The multiple insulating layers 72 are supported by such a physical bond with the multiple columnar portions CL; and the gaps 44 are maintained between the insulating layers 72.

There are also cases where the gap 44 that is formed between the foundation insulating film 40 and the insulating layer 72 of the lowermost layer is illustrated as a gap 44a to differentiate from the other gaps 44. The side surfaces of the first portions 10b of the substrate 10 are exposed in the gap 44a.

An insulating film is grown by thermal oxidation on the exposed portions of the portions including silicon. As shown in FIG. 3, a silicon oxide film is formed as the first insulating portion 41a of the insulating film 41 on the side surface of the first portion 10b. The foundation insulating film 40 that is formed on the second portion 10a of the substrate 10 becomes the second insulating portion 41b of the insulating film 41.

Figure 14:
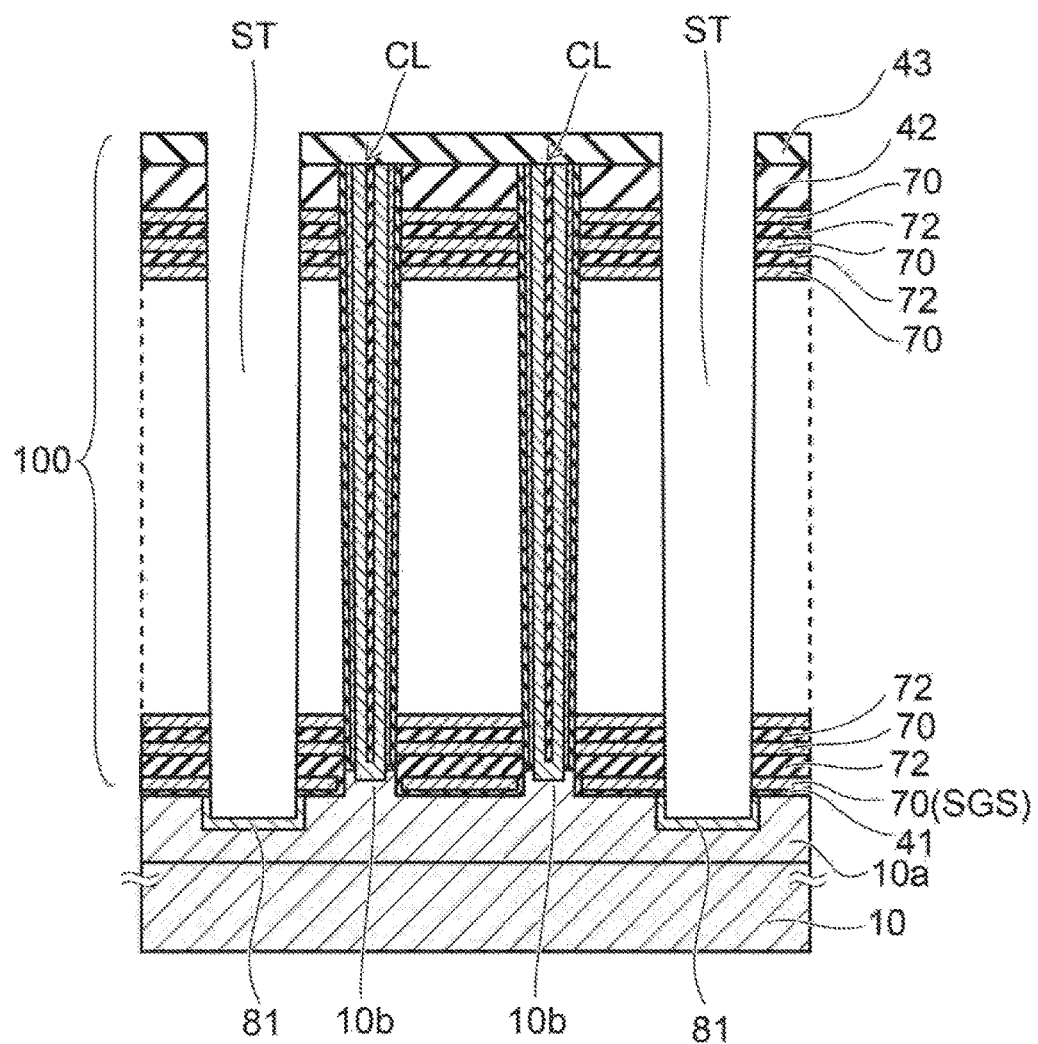

Subsequently, the electrode layers 70 shown in FIG. 3 and FIG. 14 are formed in the gaps 44. For example, tungsten layers or molybdenum layers are formed as the electrode layers 70 by chemical vapor deposition (CVD). A source gas is supplied to the gaps 44 via the slits ST.

Figure 15:
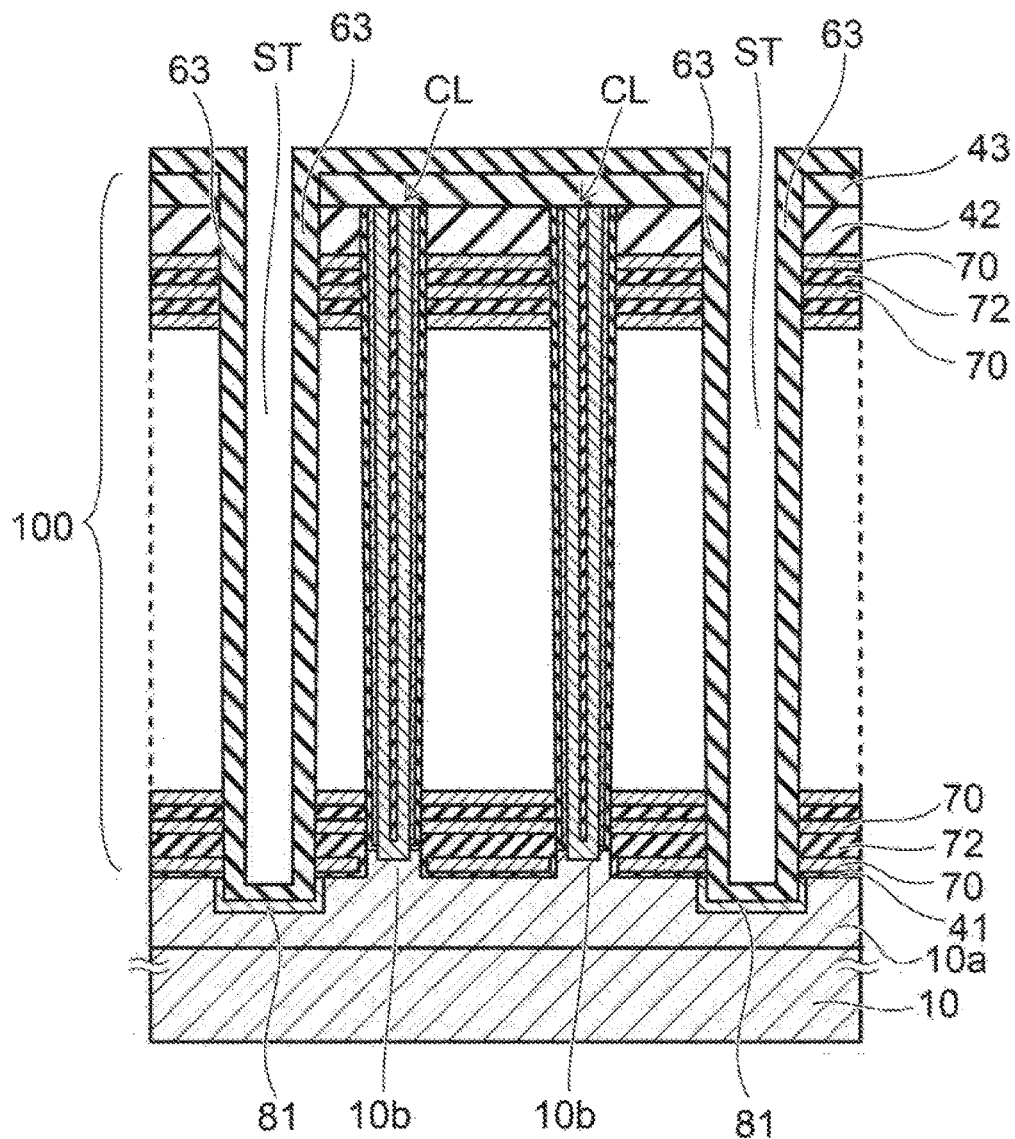

Subsequently, as shown in FIG. 15, the insulating film 63 is formed on the bottoms and side surfaces of the slits ST. After performing RIE to remove the insulating film 63 formed on the bottoms of the slits ST, the interconnect portions LI are filled into the inner side of the insulating film 63 inside the slits ST as shown in FIG. 2. The lower end portions of the interconnect portions LI contact the second portion 10a of the substrate 10 via the semiconductor regions 81.

The method for forming the semiconductor body 20 inside the memory hole MH will now be described with reference to FIG. 16A to FIG. 23B.

Figure 16A:
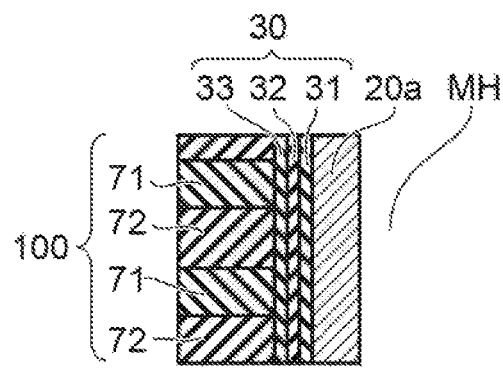
Figure 16B:
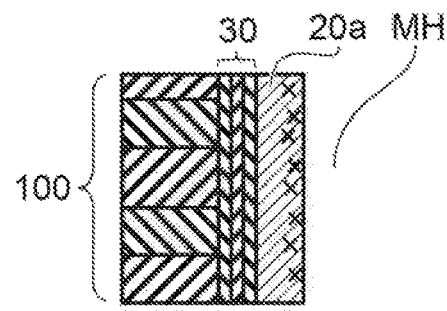

FIG. 16A corresponds to an enlarged cross-sectional view of portion B of FIG. 8. FIG. 16B to FIG. 23B also illustrate cross sections similar to FIG. 16A.

After forming the stacked film 30 inside the memory hole MH, an amorphous silicon film is formed as the cover film 20a on the side surface of the stacked film 30 and on the stacked film 30 at the bottom of the memory hole MH. The gap remains on the inner side of the cover film 20a.

Subsequently, the cover film 20a and the stacked film 30 that are deposited on the bottom of the memory hole MH are removed by RIE. In the RIE, the inner portion of the side surface of the cover film 20a adjacent to (exposed in) the gap is damaged. The RIE damage is schematically illustrated as "x" in FIG. 16B.

Then, the inner portion of the cover film 20a is removed by dry etching using, for example, a gas including HBr, HCl, or HF as a gas including a halogen. For example, by controlling the time of the etching, the inner portion (the inner perimeter portion) of the cover film 20a is selectively removed; and an outer portion (an outer perimeter portion) that covers the tunneling insulating film 31 remains.

Figure 16C:
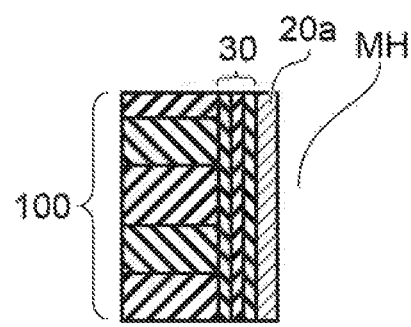
Figure 16D:
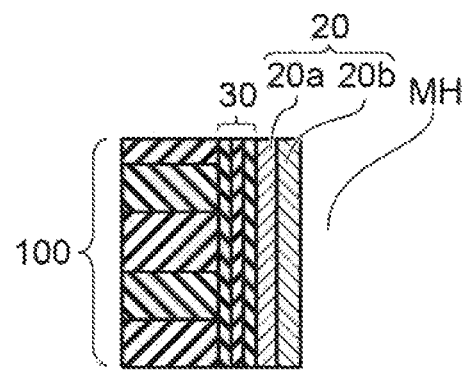

The RIE damage portion of the cover film 20a is removed; and the side surface of the portion of the cover film 20a that is not damaged is exposed in the gap inside the memory hole MH as shown in FIG. 16C. The halogen is adsorbed on the side surface of the cover film 20a. An amorphous silicon film is formed as the semiconductor film 20b on the side surface of the cover film 20a as shown in FIG. 16D.

Subsequently, the cover film 20a and the semiconductor film 20b are crystallized by annealing. Accordingly, the semiconductor body 20 that is a polycrystalline silicon film is formed on the side surface of the stacked film 30 and on the bottom of the memory hole MH.

The semiconductor body 20 that has high mobility is obtained by the removal of the RIE damage portion of the cover film 20a. When etching to remove the damage portion of the cover film 20a, the tunneling insulating film 31 is not exposed to the halogen; and film property degradation of the tunneling insulating film 31 and film formation obstruction of the semiconductor film 20b are not caused.

Because a halogen is used in the etching of the RIE damage portion, the halogen (e.g., Br, Cl, or F) segregates at the interface between the cover film 20a and the semiconductor film 20b in the film thickness direction of the semiconductor body 20. In other words, the halogen concentration of the interface between the cover film 20a and the semiconductor film 20b is higher than the halogen concentration of the interface between the cover film 20a and the stacked film 30 and the halogen concentration of the interface between the semiconductor film 20b and the core film 50 shown in FIG. 2.

Another example of the method for forming the semiconductor body 20 will now be described with reference to FIG. 17A to FIG. 18C.

Figure 17A:
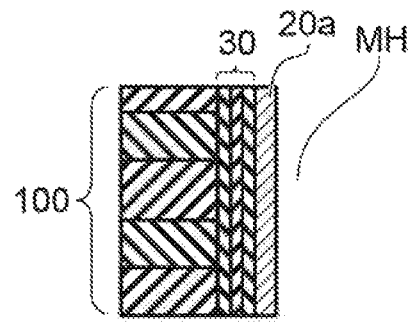

After forming the stacked film 30 inside the memory hole MH, an amorphous silicon film is formed as the first cover film 20a on the side surface of the stacked film 30 and on the stacked film 30 at the bottom of the memory hole MH as shown in FIG. 17A.

Figure 17B:
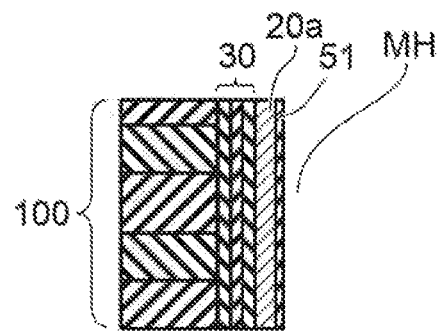

As shown in FIG. 17B, a stopper film 51 is formed on the inner side of the first cover film 20a. The stopper film 51 is a film of a material different from that of the first cover film 20a, e.g., a silicon oxide film.

Figure 17C:
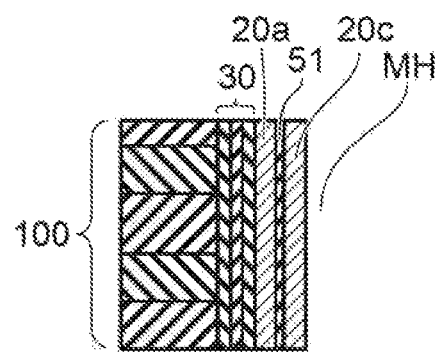
Figure 17D:
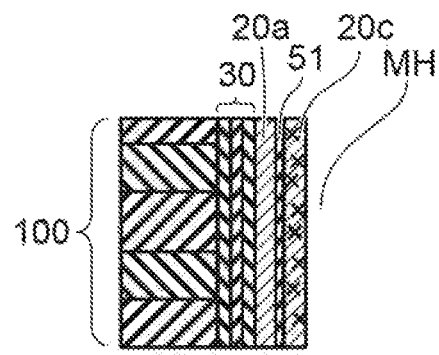

Further, as shown in FIG. 17C, an amorphous silicon film is formed as a second cover film 20c on the inner side of the stopper film 51. A gap remains on the inner side of the second cover film 20c.

Figure 24A:
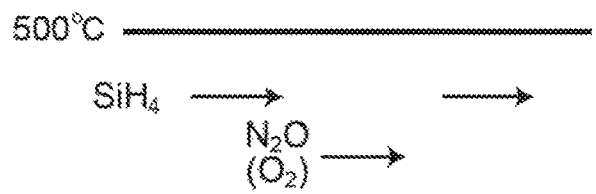
FIG. 24A is a timing, chart showing the film formation sequence of the first cover film 20a, the stopper film 51 in FIGS. 17A to 17C, and the second cover film 20c.

FIG. 24A is a timing chart showing the film formation sequence of the first cover film 20a, the stopper film 51, and the second cover film 20c.

The first cover film 20a, the stopper film 51 and the second cover film 20c are formed continuously by CVD by switching the source gases introduced to the interior of a film formation chamber. For example, first, the first cover film (the amorphous silicon film) 20a is formed by introducing SiH$_4$ gas to the interior of the chamber at a temperature condition of about 500° C.; continuing, the stopper film (the silicon oxide film) 51 is formed by thermal oxidation of the front surface of the first cover film 20a by switching the gas introduced to the interior of the chamber to N$_2$O gas or O$_2$ gas; continuing, the second cover film (the amorphous silicon film) 20c is formed by switching the gas introduced to the interior of the chamber again to SiH$_4$ gas.

After forming the second cover film 20c, RIE is performed to remove the second cover film 20c, the stopper film 51, the first cover film 20a, and the stacked film 30 that are deposited on the bottom of the memory hole MH. In the RIE, the second cover film 20c that is adjacent to (exposed in) the gap is damaged. The RIE damage is illustrated schematically as "x" in FIG. 17D.

Figure 18A:
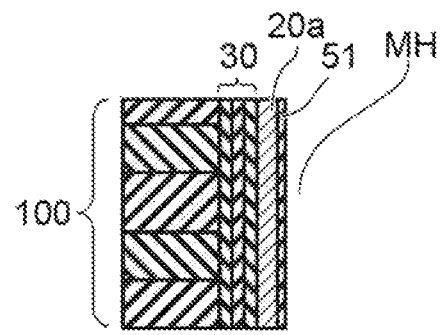

Then, the second cover film 20c is removed by dry etching using, for example, a gas including HBr, HCl, or HF as a gas including a halogen. At this time, the stopper film 51 functions as an etching stopper; and the first cover film 20a that covers the tunneling insulating film 31 can be reliably caused to remain. The second cover film 20c that undergoes the RIE damage is removed; and the stopper film 51 is exposed in the gap inside the memory hole MH as shown in FIG. 18A.

Figure 18B:
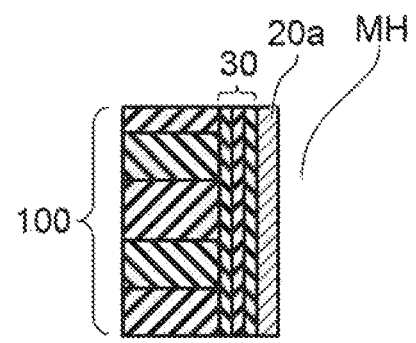
Figure 18C:
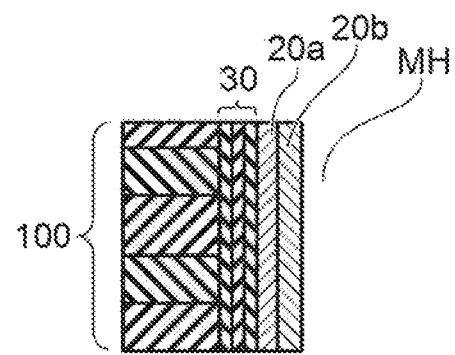

Further, the stopper film 51 is removed by, for example, etching using a gas including HF; and the side surface of the first cover film 20a that does not undergo the RIE damage is exposed in the gap inside the memory hole MH as shown in FIG. 18B. F is adsorbed as a halogen on the side surface of the first cover film 20a. As shown in FIG. 18C, an amorphous silicon film is formed as the semiconductor film 20b on the side surface of the first cover film 20a.

Subsequently, the cover film 20a and the semiconductor film 20b are crystallized by annealing. Accordingly, the semiconductor body 20 that is a polycrystalline silicon film is 3g formed on the side surface of the stacked film 30 and on the bottom of the memory hole MH.

The semiconductor body 20 that has high mobility is obtained by removing the second cover film 20c that undergoes the RIE damage. When etching to remove the second cover film 20c, the tunneling insulating film 31 is not exposed to the halogen; and film property degradation of the tunneling insulating film 31 and film formation obstruction of the semiconductor film 20b are not caused.

The halogen segregates at the interface between the cover film 20a and the semiconductor film 20b in the film thickness direction of the semiconductor body 20. In other words, the halogen concentration at the interface between the cover film 20a and the semiconductor film 20b is higher than the halogen concentration of the interface between the cover film 20a and the stacked film 30 and the halogen concentration of the interface between the semiconductor film 20b and the core film 50 shown in FIG. 2.

Another example of the method for forming the semiconductor body 20 will now be described with reference to FIG. 19A to FIG. 19D.

Figure 19A:
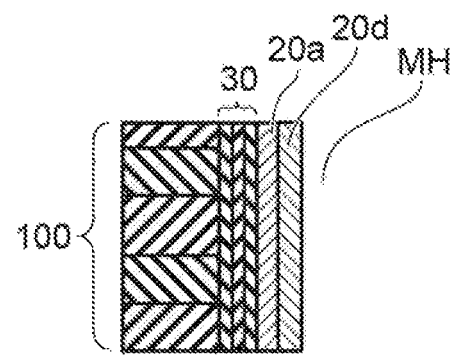
Figure 19B:
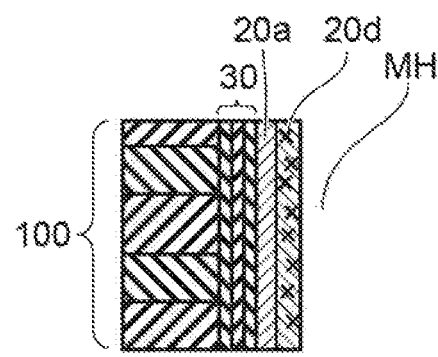

After forming the stacked film 30 inside the memory hole MH, an amorphous silicon film is formed as the first cover film 20a on the side surface of the stacked film 30 and on the stacked film 30 at the bottom of the memory hole MH as shown in FIG. 19A.

A second cover film 20d is formed on the inner side of the first cover film 20a. The gap remains on the inner side of the second cover film 20d. The second cover film 20d is a phosphorus-doped amorphous silicon film. The phosphorus (P) concentration of the second cover film 20d is higher than the phosphorus concentration of the first cover film 20a. The first cover film 20a is a substantially undoped amorphous silicon film.

Figure 24B:
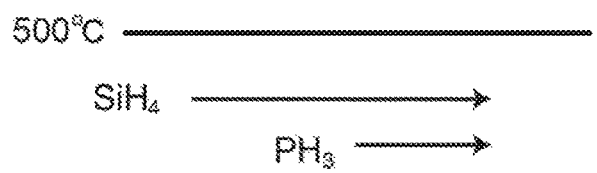
FIG. 24B is a timing chart showing the film formation sequence of the first cover film 20a and the second cover film 20d in FIGS. 19A.

FIG. 24B is a timing chart showing the film formation sequence of the first cover film 20a and the second cover film 20d.

The first cover film 20a and the second cover film 20d are formed continuously by CVD using, for example, $SiH_4$ gas as the source gas. For example, first, the first cover film 20a is formed by introducing $SiH_4$ gas to the interior of the chamber at a temperature condition of about 500° C.; continuing, the second cover film 20d which is a phosphorus-doped silicon film is formed by introducing, for example, $PH_3$ gas to the interior of the chamber.

After forming the second cover film 20d, RIE is performed to remove the second cover film 20d, the first cover film 20a, and the stacked film 30 that are deposited on the bottom of the memory hole MH. In the RIE, the second cover film 20d that is adjacent to (exposed in) the gap is damaged. The RIE damage is illustrated schematically as "x" in FIG. 19B.

Then, the second cover film 20d is removed by dry etching using, for example, a gas including HBr, HCl, or HF as a gas including a halogen. At this time, the etching rate of the second cover film 20d which is a phosphorus-doped silicon film is faster than that of the first cover film 20a which is an undoped silicon film. For example, when etching using HBr gas, the etching rate of the phosphorus-doped silicon film is not less than 3 times the etching rate of the undoped silicon film. Therefore, the first cover film 20a that covers the tunneling insulating film 31 can be reliably caused to remain.

Figure 19C:
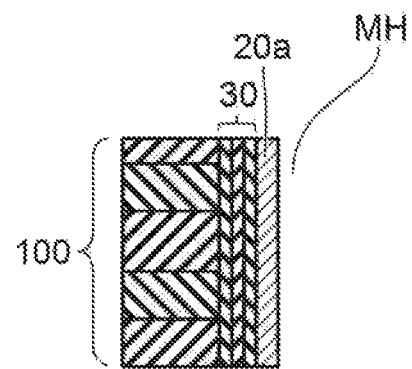
Figure 19D:
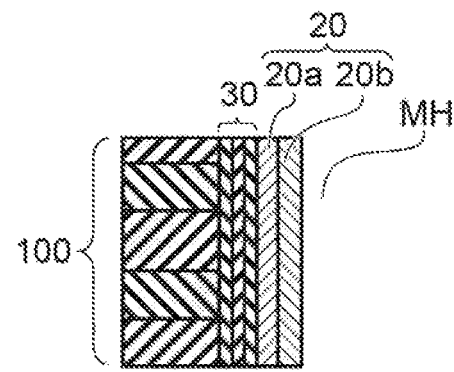

The second cover film 20d that undergoes the RIE damage is removed; and the side surface of the first cover film 20a that does not undergo the RIE damage is exposed in the gap inside the memory hole MH as shown in FIG. 19C. The halogen is adsorbed on the side surface of the first cover film 20a. As shown in FIG. 19D, an amorphous silicon film is formed as the semiconductor film 20b on the side surface of the first cover film 20a.

Subsequently, the cover film 20a and the semiconductor film 20b are crystallized by annealing. Accordingly, the semiconductor body 20 that is a polycrystalline silicon film is formed on the side surface of the stacked film 30 and on the bottom of the memory hole MH.

The semiconductor body 20 that has high mobility is obtained by the removal of the second cover film 20d that undergoes the RIE damage. When etching to remove the second cover film 20d, the tunneling insulating film 31 is not exposed to the halogen; and film property degradation of the tunneling insulating film 31 and film formation obstruction of the semiconductor film 20b are not caused.

The halogen segregates at the interface between the cover film 20a and the semiconductor film 20b in the film thickness direction of the semiconductor body 20. In other words, the halogen concentration of the interface between the cover film 20a and the semiconductor film 20b is higher than the halogen concentration of the interface between the cover film 20a and the stacked film 30 and the halogen concentration of the interface between the semiconductor film 20b and the core film 50 shown in FIG. 2

Another example of the method for forming the semiconductor body 20 will now be described with reference to FIG. 20A to FIG. 21B.

Figure 20A:
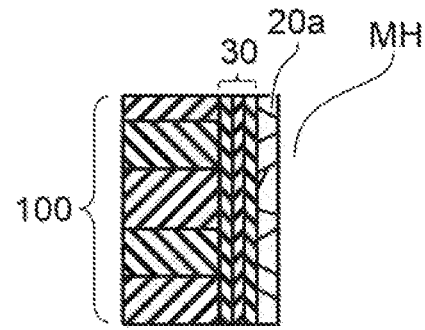

After forming the stacked film 30 inside the memory hole MH, the first cover film 20a is formed on the side surface of the stacked film 30 and on, the stacked film 30 at the bottom of the memory hole MH as shown in FIG. 20A. After the first cover film 20a is formed as an amorphous silicon film, the first cover film 20a is crystallized to become a polycrystalline silicon film by annealing.

Figure 20B:
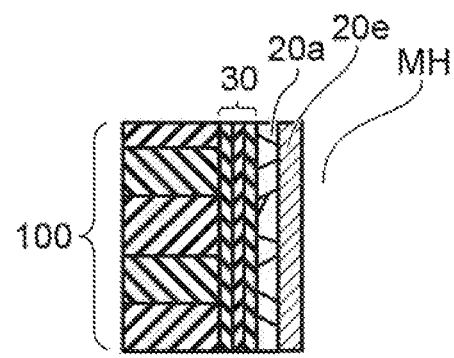
Figure 20C:
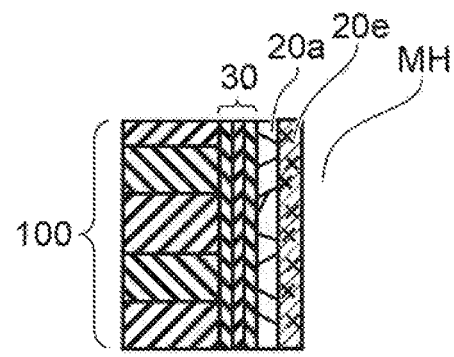

As shown in FIG. 20B, an amorphous silicon film is formed as a second cover film 20e on the inner side of the first cover film (the polycrystalline silicon film) 20a.

Figure 24C:
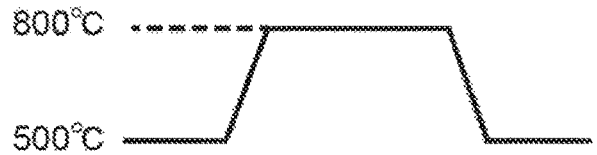
FIG. 24C is a timing chart showing the film formation sequence of the first cover film 20a and the second cover film 20e in FIGS. 20A and 20B.

FIG. 24C is a timing chart showing the film, formation sequence of the first cover film 20a and the second cover film 20e.

The first cover film 20a and the second cover film 20e are formed continuously by CVD using, for example, $SiH_4$ gas as the source gas. For example, first, an amorphous silicon film (the first cover film 20a) is formed at a temperature condition of about 500° C.; subsequently, the amorphous silicon film (the first cover film 20a) is crystallized by annealing at 800° C. or more; and the first cover film 20a of the polycrystalline silicon film is formed. Subsequently, an amorphous silicon film is formed again as the second cover film 20e at a temperature condition of about 500° C.

After forming the second cover film 20e, RIE is performed to remove the second cover film 20e, the first cover film 20a, and the stacked film 30 that are deposited on the bottom of the memory hole MH. In the RIE, the second cover film 20e that is adjacent to (exposed in) the gap is damaged. The RIE damage is illustrated schematically as "x" in FIG. 20C.

Then, the second cover film 20e is removed by dry etching using, for example, a gas, including HBr, HCl, or HF as a gas including a halogen. At this time, the etching rate of the second cover film 20e which is an amorphous silicon film is faster than that of the first cover film 20a which is a polycrystalline silicon film. Therefore, the first cover film 20a that covers the tunneling insulating film 31 can be reliably caused to remain.

Figure 21A:
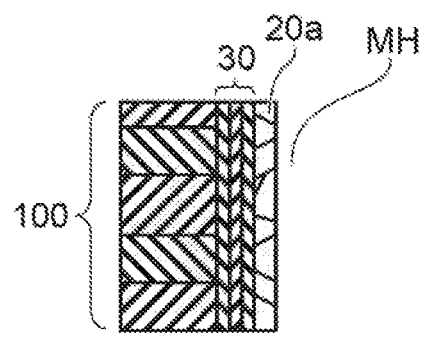
Figure 21B:
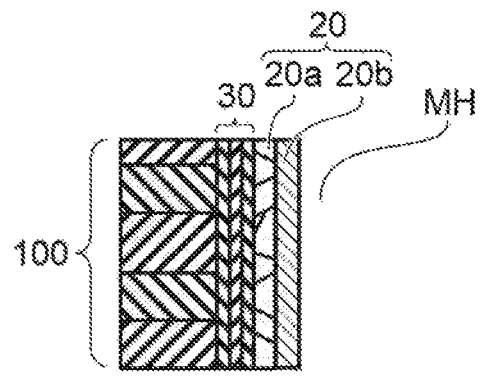

The second cover film 20e that undergoes the RIE damage is removed; and the side surface of the first cover film 20a that does not undergo the RIE damage is exposed in the gap inside the memory hole MH as shown in FIG. 21A. The halogen is adsorbed on the side surface of the first cover film 20a. As shown in FIG. 21B, an amorphous silicon film is formed as the semiconductor film 20b on the side surface of the first cover film 20a.

Subsequently, the semiconductor film 20b is crystallized by annealing. Accordingly, the semiconductor body 20 that is a polycrystalline silicon film is formed on the side surface of the, stacked film 30 and on the bottom of the memory hole MH.

The annealing that crystallizes the semiconductor film 20b is performed also on the cover film 20a that is already crystallized; and the grain size increase of the crystal of the cover film 20a proceeds. Accordingly, the average grain size of the crystal of the cover film 20a is larger than the average grain size of the crystal of the semiconductor film 20b.

The channel mobility of the semiconductor body 20 can be high because the average grain size of the cover film 20a, which is more proximal to the electrode layer 70 side and is more easily affected by the potential control of the electrode layers 70 than is the semiconductor film 20b, is larger than the average grain size of the semiconductor film 20b.

The semiconductor body 20 that has high mobility is obtained by the removal of the second cover film 20e that undergoes the RIE damage. When etching to remove the second cover film 20e, the tunneling insulating film 31 is not exposed to the halogen; and film property degradation of the tunneling insulating film 31 and film formation obstruction of the semiconductor film 20b are not caused.

The halogen segregates at the interface between the cover film 20a and the semiconductor film 20b in the film thickness direction of the semiconductor body 20. In other words, the halogen concentration of the interface between the cover film 20a and the semiconductor film 20b is higher than the halogen concentration of the interface between the cover film 20a and the stacked film 30 and the halogen concentration of the interface between the semiconductor film 20b and the core film 50 shown in FIG. 2.

Another example of the method for forming the semiconductor body 20 will now be described with reference to FIG. 22A to FIG. 23B.

Figure 22A:
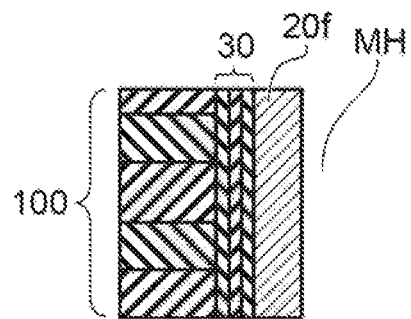
Figure 22B:
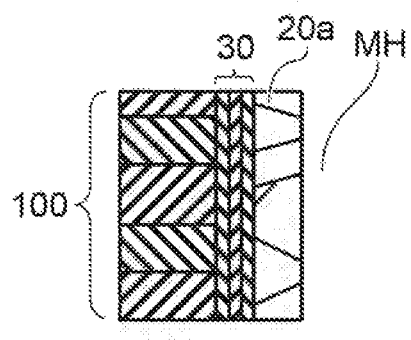
Figure 22C:
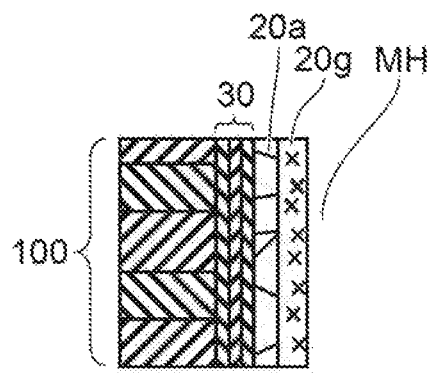

After forming the stacked film 30 inside the memory hole MH, a cover film 20f of an amorphous silicon film is formed on the side surface of the stacked film 30 and on the stacked film 30 at the bottom of the memory hole MH as shown in FIG. 22A. Subsequently, the amorphous silicon film is crystallized by annealing and becomes the cover film 20a of a polycrystalline silicon film as shown in FIG. 22B.

After forming the cover film 20a of a polycrystalline silicon film, the cover film 20a and the stacked film 30 that are deposited on the bottom of the memory hole MH are removed by RIE. In the RIE, the inner portion of the cover film 20a adjacent to (exposed in) the gap is damaged. The RIE damage of an inner portion 20g of the cover film is illustrated schematically as "x" in FIG. 22C. The inner portion 20g of the cover film 20a of the polycrystalline silicon film undergoing the RIE damage is amorphized.

Then, the inner portion 20g of the cover film is removed by dry etching using, for example, a gas including HBr, HCl, or HF as a gas including a halogen. At this time, the etching rate of the amorphized inner portion 20g is faster than that of the polycrystallized portion 20a. Therefore, the cover film 20a that covers the tunneling insulating film 31 can be reliably caused to remain.

Figure 23A:
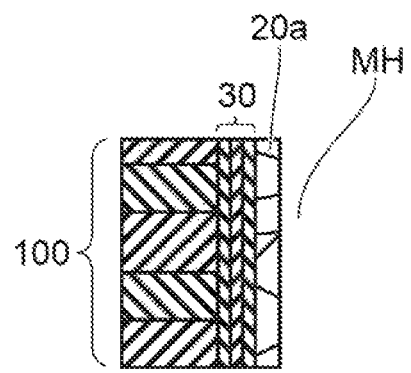
Figure 23B:
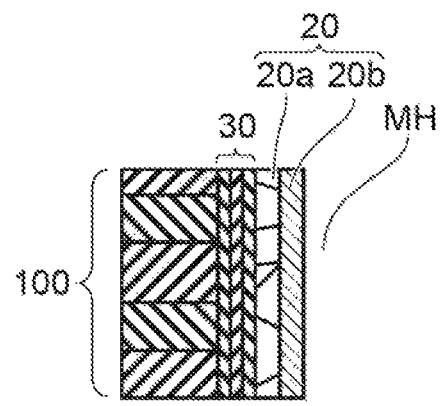

The inner portion 20g that undergoes the RIE damage is removed; and the side surface of the cover film 20a that does not undergo the RIE damage is exposed in the gap inside the memory hole MH as shown in FIG. 23A. The halogen is adsorbed on the side surface of the cover film 20a. As shown in FIG. 23B, an amorphous silicon film is formed as the semiconductor film 20b on the side surface of the cover film 20a.

Subsequently, the semiconductor film 20b is crystallized by annealing. Accordingly, the semiconductor body 20 that is a polycrystalline silicon film is formed on the side surface of the stacked film 30 and on the bottom of the memory hole MH.

The annealing to crystallize the semiconductor film 20b is performed also on the cover film 20a that is already crystallized; and the grain size increase of the crystal of the cover film 20a proceeds. Accordingly, the average grain size of the crystal of the cover film 20a is larger than the average grain size of the crystal of the semiconductor film 20b.

The channel mobility of the semiconductor body 20 can be high because the average grain size of the cover film 20a, which is more proximal to the electrode layer 70 side and is more affected by the potential control of the electrode layers 70 than the semiconductor film 20b, is larger than the average grain size of the semiconductor film 20b.

The semiconductor body 20 that has high mobility is obtained by the removal of the inner portion 20g that undergoes the RIE damage. When etching to remove the inner portion 20g, the tunneling insulating film 31 is not exposed to the halogen; and film property degradation of the tunneling insulating film 31 and film formation obstruction of the semiconductor film 20b are not caused.

The halogen segregates at the interface between the cover film 20a and the semiconductor film 20b in the film thickness direction of the semiconductor body 20. In other words, the halogen concentration of the interface between the cover film 20a and the semiconductor film 20b is higher than the halogen concentration of the interface between the cover film 20a and the stacked film 30 and the halogen concentration of the interface between the semiconductor film 20b and the core film 50 shown in FIG. 2.

Figure 25:
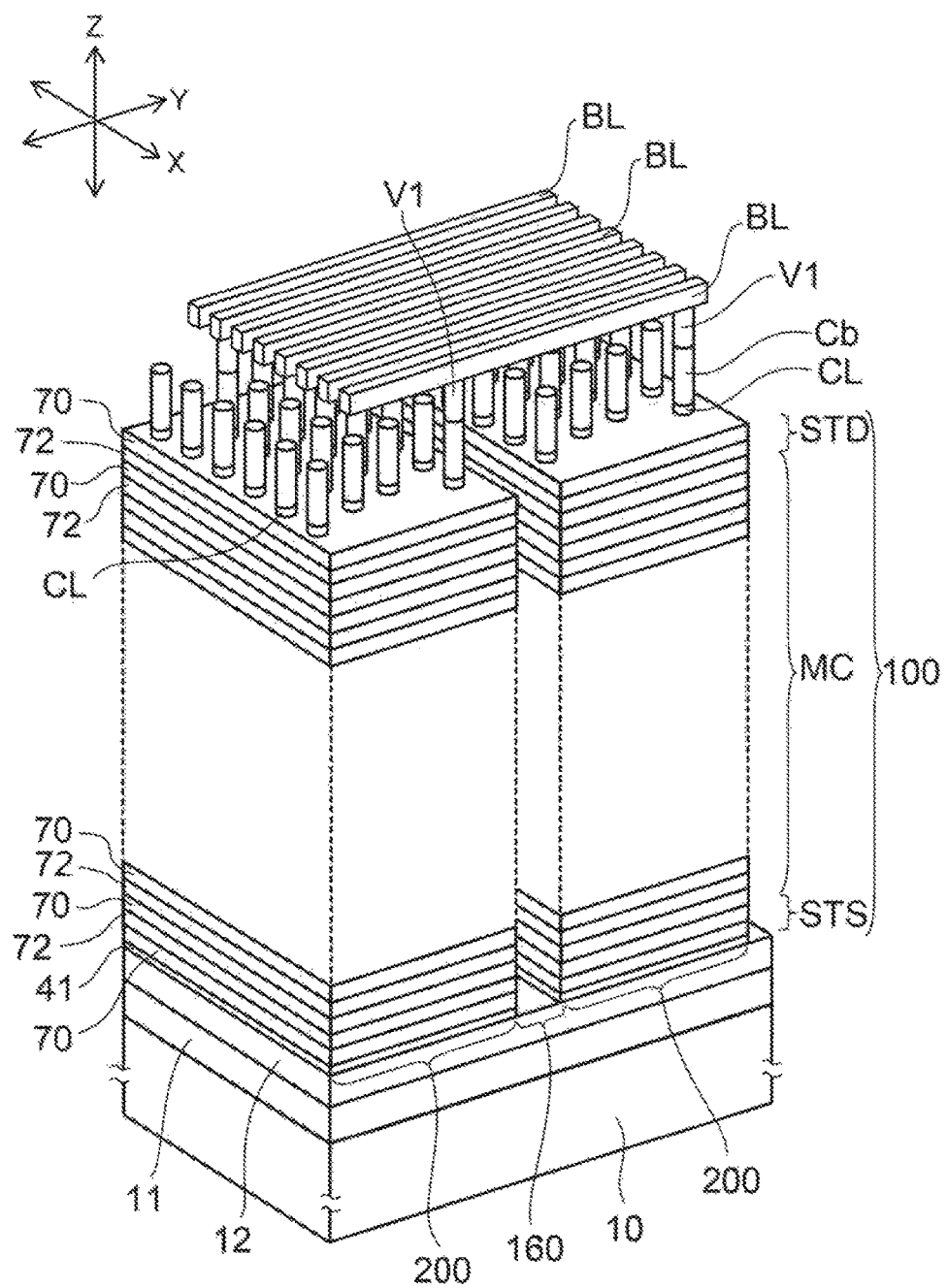
FIG. 25 is a schematic perspective view of another example of the memory cell array of the embodiment.

FIG. 25 is a schematic perspective view of another example of the memory cell array of the embodiment.

A first foundation layer 11 and a second foundation layer 12 are provided between the substrate 10 and the stacked body 100. The first foundation layer 11 is provided between the substrate 10 and the second foundation layer 12; and the second foundation layer 12 is provided between the first foundation layer 11 and the stacked body 100.

The second foundation layer 12 is a semiconductor layer or a conductive layer. Or, the second foundation layer 12 may include a stacked film of a semiconductor layer and a conductive layer. The first foundation layer 11 includes transistors and interconnects forming a control circuit.

The lower ends of the first semiconductor films 20b of the semiconductor bodies 20 of the columnar portions CL contact the second foundation layer 12; and the second foundation layer 12 is connected to the control circuit. Accordingly, the lower ends of the semiconductor bodies 20 of the columnar portions CL are electrically connected to the control circuit via the second foundation layer 12. In other words, the second foundation layer 12 can be used as a source layer.

The stacked body 100 is divided into the multiple blocks (or finger portions) 200 in the Y-direction by separation portions 160. The separation portions 160 are insulating films and do not include interconnects.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A method for manufacturing a semiconductor device, comprising:

forming a stacked body on a foundation layer, the stacked body including a plurality of first layers and a plurality of second layers, the first layers and the second layers including a first layer and a second layer stacked alternately;

forming a stacked film on a bottom and side surface of a hole, the hole extending through the stacked body in a stacking direction of the stacked body;

forming a cover film inside the hole on a side surface of the stacked film and on the stacked film at the bottom, a gap remaining on an inner side of the cover film, the cover film being a silicon film;

annealing the cover film to crystallize the cover film after forming the cover film to be amorphous;

exposing the foundation layer at the bottom of the hole by removing the stacked film and the cover film at the bottom of the hole by reactive ion etching (RIE);

removing a portion of the cover film at the side surface of the hole adjacent to the gap after the removing of the stacked film and the cover film at the bottom; and forming a semiconductor film on aside surface of the cover film and on the bottom of the hole after the removing of the portion of the cover film adjacent to the gap, a portion of the crystallized cover film adjacent to the gap being amorphized in the RIE, and the amorphized portion of the cover film being removed by etching using a gas including a halogen.

* * * * *